(12) United States Patent
Jia et al.

(10) Patent No.: US 10,505,568 B2
(45) Date of Patent: Dec. 10, 2019

(54) SYSTEMS AND METHODS FOR OUTER CODING

(71) Applicants: Ming Jia, Ottawa (CA); Jianglei Ma, Ottawa (CA)

(72) Inventors: Ming Jia, Ottawa (CA); Jianglei Ma, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 80 days.

(21) Appl. No.: 15/718,523

(22) Filed: Sep. 28, 2017

(65) Prior Publication Data
US 2018/0159660 A1 Jun. 7, 2018

Related U.S. Application Data

(60) Provisional application No. 62/429,672, filed on Dec. 2, 2016.

(51) Int. Cl.
H03M 13/00 (2006.01)
H04L 1/00 (2006.01)
(Continued)

(52) U.S. Cl.
CPC ..... *H03M 13/6306* (2013.01); *H03M 13/2906* (2013.01); *H04L 1/0041* (2013.01);
(Continued)

(58) Field of Classification Search
CPC ....... H04L 1/18; H04L 1/0041; H04L 1/0045; H04L 1/0058; H04L 1/0061;
(Continued)

(56) References Cited

U.S. PATENT DOCUMENTS 8,234,551 B2 7/2012 Shen et al.
9,391,640 B2 7/2016 Murakami
(Continued)

FOREIGN PATENT DOCUMENTS

WO 2016045391 A1 3/2016

OTHER PUBLICATIONS

ZTE, ZTE Microelectronics, R1-1608976 "Consideration on Outer Codes for NR", 3GPP TSG RAN Meeting WG1 #86bis, Oct. 10-14, 2016, pp. 1-9, Lisbon, Portugal.
(Continued)

*Primary Examiner* — Shelly A Chase

(57) ABSTRACT

Embodiments relate to outer coding in communications between a first network device and a second network device. A transport block (TB) and a first parity code block that is based on contents of the TB are transmitted from the first network device to the second network device. The first network device receives feedback information that is transmitted from the second network device. The feedback information indicates a decoding failure of the TB. The first network device generates a second parity check CB that is based on the contents of the TB and is different from the first parity check CB and transmits the second parity check CB to the second network device. The second network device receives the second parity check CB and performs error detection decoding of the TB based on the second parity check CB.

24 Claims, 11 Drawing Sheets

(51) Int. Cl.
  *H03M 13/29* (2006.01)
  *H04L 1/18* (2006.01)
  *H03M 13/15* (2006.01)
(52) U.S. Cl.
  CPC .......... *H04L 1/0058* (2013.01); *H04L 1/0061* (2013.01); *H04L 1/0064* (2013.01); *H04L 1/18* (2013.01); *H03M 13/1515* (2013.01); *H04L 1/1812* (2013.01); *H04L 1/1835* (2013.01)
(58) Field of Classification Search
  CPC ....... H04L 1/0064; H04L 1/0089; H04L 1/16; H04L 1/1812; H04L 1/1896; H03M 13/116; H03M 13/2906; H03M 13/6306
  See application file for complete search history.

(56) References Cited

U.S. PATENT DOCUMENTS

| | | | |
|---|---|---|---|
| 2008/0282125 | A1 | 11/2008 | Hafeez et al. |
| 2016/0043831 | A1* | 2/2016 | Seo .......................... H04L 1/08 714/748 |
| 2017/0222754 | A1* | 8/2017 | Noh ....................... H04L 1/0045 |
| 2017/0250844 | A1* | 8/2017 | Wu ........................ H04W 76/27 |
| 2017/0279464 | A1* | 9/2017 | Noh ...................... H03M 13/116 |
| 2017/0294990 | A1 | 10/2017 | Xu et al. |
| 2018/0109355 | A1* | 4/2018 | Werner ................. H04L 1/0089 |

OTHER PUBLICATIONS

Qualcomm Incorprated, R1-1610143 "Erasure coding and HARQ Design", 3GPP TSG-RAN Meeting WG1 #86bis, Oct. 10-14, 2016, pp. 1-7, Lisbon, Portugal.

ZTE,"Discussion on channel coding for new radio interface",3GPP TSG RAN WG1 #84bis R1-162230,Busan, Korea Apr. 11-15, 2016,total 12 pages.

* cited by examiner

SYSTEMS AND METHODS FOR OUTER CODING

CROSS-REFERENCE TO RELATED APPLICATION

The present application claims the benefit of U.S. Provisional Application No. 62/429,672, entitled "System and Method for Outer Coding", filed on Dec. 2, 2016, the entire contents of which are incorporated herein by reference.

FIELD

The subject matter of the invention relates to wireless communications and, more particularly, outer coding for hybrid automatic repeat request (H-ARQ).

BACKGROUND

In some wireless communication systems, a user equipment (UE) wirelessly communicates with a base station to send data to the base station and/or receive data from the base station. A wireless communication from a UE to a base station is referred to as an uplink communication, and a wireless communication from a base station to a UE is referred to as a downlink communication.

Resources are required to perform uplink and downlink communications. For example, a UE may wirelessly transmit data to a base station in an uplink transmission at a particular frequency and/or during a particular slot in time. The frequency and time slot used are examples of resources.

In some wireless communication systems, if a UE is to transmit data to a base station, the UE requests uplink resources from the base station. The base station grants the uplink resources, and then the UE sends the uplink transmission using the granted uplink resources. An example of uplink resources that may be granted by the base station is a set of time/frequency locations in an uplink orthogonal frequency-division multiple access (OFDMA) frame.

Channel coding, such as forward error-correction coding or error-correction coding, introduces redundancy into a signal prior to transmission or storage of the signal. The redundancy enables a receiving system to detect and, in some cases, correct errors introduced into the signal by, for example, the channel, the receiver, the transmitter, a storage medium, and the like. For example, in a communication system that employs forward error-correction coding, a source provides data to an encoder (also referred to as a coder). The encoder inserts redundant (also sometimes referred to as parity) bits, thereby outputting a longer sequence of coded bits, called a codeword. Codewords can then be transmitted to a receiver, which uses a suitable decoder to extract the original, unencoded data and may also correct errors caused by, for example, the channel and/or the receiver.

Channel coding can thus be used to detect and/or correct errors—reducing the need for the source transmitter to retransmit data that was not successfully decoded. By reducing the need to retransmit data that is not successfully decoded, the throughput of the channel or link is improved.

In the current LTE design, a transport block (TB) can be divided into several forward error correction (FEC) blocks, and these FEC blocks will be scheduled by the scheduler. H-ARQ retransmission, however, is TB based to reduce the complexity of network devices by limiting the number of concurrent H-ARQ processes to 8. If the decoding of one FEC block within a TB transmission fails (via cyclic redundancy code (CRC) check), the redundant versions of all the FEC blocks will have to be retransmitted, even though some of the FEC blocks may have been correctly decoded.

In fifth-generation (5G) wireless communications, major communication scenarios include eMBB (enhanced Mobile Broadband), mMTC (massive Machine Type Communications) and URLLC (Ultra-Reliable and Low Latency Communications). A core requirement of mMTC is to provide massive service connectivity with low energy consumption and low cost. In URLLC, extreme requirements on transmission availability and reliability are emphasized, which means low error probability and low outage rate are main targets. For eMBB, high system capacity, high data rate, and high spectrum efficiency are main targets.

It has been envisioned that there may be different frame structure designs for different usage scenarios. For instance, a short transmission time interval has been identified as a way to meet the latency target for URLLC. Considering the diverse usage scenarios of the 5 G air interface, also known as new radio (NR), it is possible to have one deployment covering multiple scenarios. For example, an evolved Node B (eNB) or a gNodeB (gNB) may need to support eMBB and URLLC services at the same time. In another example, an eMBB eNB may have multiple neighbor cells providing URLLC service. However, supporting the desired levels of service could be challenging due to the burst interference caused by such coexistence of different usage scenarios. Short transmission of URLLC packets may appear as bursty interference to an eMBB transmission, for example. In the coexistence of eMBB and URLLC, the bursty interference may erase a portion of a transmission and hence cause a code block to be uncorrectable even at high signal to noise ratio (SNR). The failed decoding of such a coding block (CB) leads to a decoding failure of the whole TB.

SUMMARY

According to one aspect of the present disclosure, a method involves transmitting, by a first network device to a second network device, a transport block (TB) and a first parity check code block (CB) that is based on contents of the TB, and receiving, by the first network device, feedback information from the second network device. The feedback information indicates a decoding failure of the TB. The method also involves generating, by the first network device, a second parity check CB that is based on the contents of the TB and is different from the first parity check CB, and transmitting, by the first network device, the second parity check CB to the second network device.

Another aspect provides a network device that includes a processor and a computer readable storage medium. The computer readable storage medium stores programming for execution by the processor. The programming includes instructions to perform actions in accordance with a method that involves transmitting, by the network device to a second network device, a TB and a first parity check CB that is based on contents of the TB, and receiving feedback information from the second network device, wherein the feedback information indicates a decoding failure of the TB; generating a second parity check CB that is based on the contents of the TB and is different from the first parity check CB; and transmitting the second parity check CB to the second network device.

According to a further aspect, a method involves receiving, by a second network device from a first network device, a TB and a first parity check CB that is based on contents of the TB, and sending, by the second network device, feedback information to the first network device. As described above, the feedback information indicates a decoding failure of the TB. The method also involves receiving, by the second network device, a second parity check CB from the first network device. The second parity check CB is based on the contents of the TB and is different from the first parity check CB. The second network device performs error detection decoding of the TB based on the encoded second parity check CB.

In a network device that includes a processor and a computer readable storage medium, the computer readable storage medium could store programming, for execution by the processor, that includes instructions to perform actions in accordance with such a method. According to this example, the method involves receiving, by the network device from a first network device, a TB and a first parity check CB that is based on contents of the TB; sending to the first network device feedback information that indicates a decoding failure of the TB; receiving from the first network device a second parity check CB that is based on the contents of the TB and is different from the first parity check CB; and performing error detection decoding of the TB based on the second parity check CB.

Embodiments of the subject matter disclosed herein may also provide for an outer coding system and methods for minimizing the error rate of data.

One embodiment provides an encoding apparatus and an encoding method performed by a first network device. The method is performed between a first network device and a second network device. If the first network device is a UE, then the second network device is a base station; if the first network device is a base station, then the second network device is a UE. The first network device receives a second feedback information from a second network device. The second feedback information indicates decoding failure of a transport block (TB) including N coding blocks (CBs) for a second time. The first network device performs a cyclic shift parity check scheme to obtain a shifted parity check CB; encodes the shifted parity check CB to obtain an encoded parity check codeword; transmits the encoded parity check codeword to the second network device.

One embodiment provides a decoding apparatus and a decoding method performed by a second network device. The second network device receives the encoded parity check codeword from the first network device; wherein the encoded parity check codeword is obtained according to a cyclic shift parity check scheme; and decodes the encoded parity check codeword.

Using a cyclic shift parity check scheme, in a scenario of unsuccessfully decoding CBs, embodiments can use the shifted version of parity check CBs as outer codes. The new cyclic shift to obtain a shifted parity check CB does not require advance knowledge of, or in other words does not need to know in advance, how many parity check CBs (also referred to herein as PBs) are needed. In an embodiment, the first data retransmission uses the single parity check CB, and the second data retransmission uses a shifted parity check CB. The receiver can correctly decode the CBs, and also the decoding using more than one parity check CB can be performed without undue complexity.

Other aspects and features will become apparent to those of ordinary skill in the art upon review of the following description.

BRIEF DESCRIPTION OF THE DRAWINGS

Embodiments will be described, by way of example only, with reference to the accompanying figures wherein.

DETAILED DESCRIPTION

Figure 1:
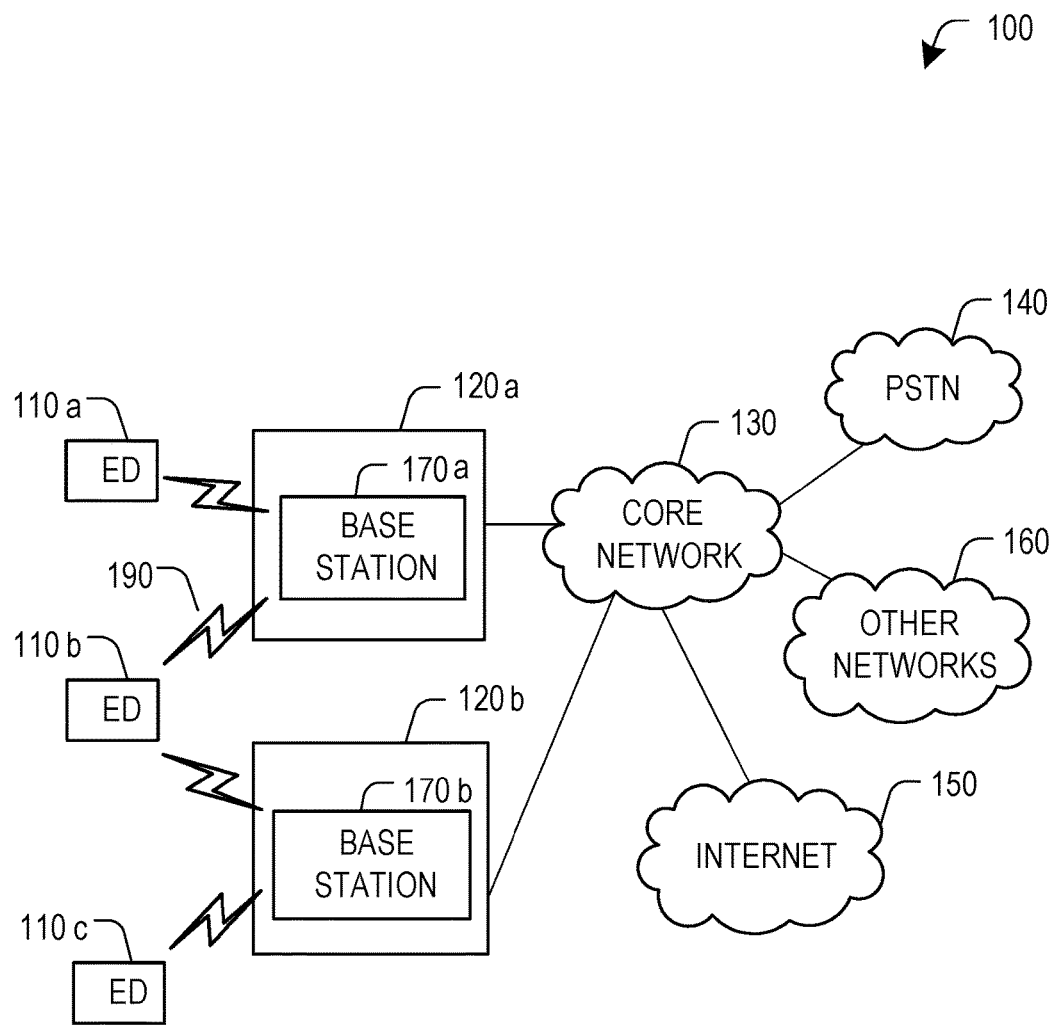
FIG. 1 illustrates a block diagram of a wireless network for communicating data.

For illustrative purposes, specific example embodiments will now be explained in greater detail below in conjunction with the figures.

One embodiment provides a method performed by a first network device, and the method is performed between a first network device and a second network device. If the first network device is a UE, then the second network device is a base station; if the first network device is a base station, then the second network device is a UE. The first network device receives a second feedback information from a second network device; wherein the second feedback information indicates decoding failure of a transport block (TB) including N coding blocks (CBs) for a second time; then the first network device performs a cyclic shift parity check scheme to obtain a shifted parity check CB; encodes the shifted parity check CB to obtain an encoded parity check codeword; transmits the encoded parity check codeword to the second network device. The second network device receives the encoded parity check codeword from the first network device; wherein the encoded parity check codeword is obtained according to a cyclic shift parity check scheme; and decodes the encoded parity check codeword. Using a cyclic shift parity check scheme, in a scenario of unsuccessfully decoding CBs, embodiments can use the shifted version of parity check CBs as outer codes. The new cyclic shift to obtain a shifted parity check CB does not require advance knowledge of, or in other words does not need to know in advance, how many parity check CBs (also referred to herein as PBs) are needed. The particular failed CBs for which decoding failed also does not need to be known in advance. As long as the number of transmitted parity check CBs is greater than or equal to the number of failed CBs, the transmitter also requires no advance knowledge of how many CBs were failed. In an embodiment, the first data retransmission uses the single parity check CB, and the second data retransmission uses a shifted parity check CB. The receiver can correctly decode the CBs, and also the decoding using more than one parity check CB can be performed with reduced complexity.

In one aspect of the embodiment, before receiving the indication of the second instance of decoding failure, the method further includes receiving a first feedback information from the second network device, wherein the first feedback information indicates decoding failure of the TB for a first time; performing a parity check scheme for the CBs to obtain a parity check CB; and encoding the parity check CB to obtain an encoded parity codeword.

In one aspect of the embodiment, the operation of performing a cyclic shift parity check scheme includes performing a cyclic shift operation for each CB; performing an XOR operation for N CBs to obtain a shifted parity check CB. Performing the cyclic shift operation comprises, in an embodiment: performing an $(i-1)^{th}$ cyclic shift of CBs to obtain a CB $\vec{c}_i$, wherein $\vec{c}_i$ is $\{c_{i,0}, c_{i,1}, \ldots, c_{i,k-1}\}$, and k is the length of the information bits $c_{i,0}, c_{i,1}, \ldots, c_{i,k-1}$ in the CB; and in an embodiment a method also includes performing an XOR operation to obtain a shifted parity check CB $\vec{p}_2$ wherein the $\vec{p}_2$ is $p_{2,1} = \tilde{c}_{1,l}^{(0)} \oplus \tilde{c}_{2,l}^{(1)} \oplus \ldots \oplus \tilde{c}_{m,l}^{(m-1)}$, m is the number of CBs.

In one aspect of the embodiment, in the receiver side, the decoding operation comprises: performing a series of XOR operations to remove successfully decoded CBs; setting $c_{i,0}=0$ or $c_{i,0}=1$, where i is a code block index of one of the failed code blocks; performing a series of XOR operations to recover the failed code blocks.

FIG. 1 illustrates an example communication system 100, in which embodiments of the present disclosure could be implemented. In general, the communication system 100 enables multiple wireless or wired user devices to transmit and receive data and other content. The system 100 may implement one or more channel access methods, such as code division multiple access (CDMA), time division multiple access (TDMA), frequency division multiple access (FDMA), orthogonal FDMA (OFDMA), or single-carrier FDMA (SC-FDMA). The purpose of the communication system 100 may be to provide content (voice, data, video, text) via broadcast, narrowcast, user device to user device, etc. The communication system 100 may operate by sharing resources such as bandwidth.

In this example, the communication system 100 includes electronic devices (EDs) 110a-110c, radio access networks (RANs) 120a-120b, a core network 130, a public switched telephone network (PSTN) 140, the Internet 150, and other networks 160. While certain numbers of these components or elements are shown in FIG. 1, any reasonable number of these components or elements may be included in the communication system 100.

The EDs 110a-110c are configured to operate and/or communicate in the communication system 100. For example, the EDs 110a-110c are configured to transmit and/or receive via wireless or wired communication channels. Each ED 110a-110c represents any suitable end user device and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, touchpad, wireless sensor, or consumer electronics device.

In FIG. 1, the RANs 120a-120b here include base stations 170a-170b, respectively. Each base station 170a-170b is configured to wirelessly interface with one or more of the EDs 110a-110c to enable access to any other base station 170a-170b, the core network 130, the PSTN 140, the internet 150, and/or the other networks 160. For example, the base stations 170a-170b may include (or be) one or more of several well-known devices, such as a base transceiver station (BTS), a Node-B (NodeB), an evolved NodeB (eNodeB), a Home NodeB, a Home eNodeB, a gNodeB, a transmission point (TP), a site controller, an access point (AP), or a wireless router. In embodiments, any or all of the EDs 110a-110c may be alternatively or additionally configured to interface, access, or communicate with any other base station 170a-170b, the internet 150, the core network 130, the PSTN 140, the other networks 160, or any combination of the preceding. The communication system 100 may include RANs, such as RAN 120b, wherein the corresponding base station 170b accesses the core network 130 via the internet 150, as shown.

The EDs 110a-110c and base stations 170a-170b are examples of communication equipment that can be configured to implement some or all of the functionality and/or embodiments described herein. In the embodiment shown in FIG. 1, the base station 170a forms part of the RAN 120a, which may include other base stations, base station controller(s) (BSC), radio network controller(s) (RNC), relay nodes, elements, and/or devices. Any base station 170a, 170b may be a single element, as shown, or multiple elements, distributed in the corresponding RAN, or otherwise. Also, the base station 170b forms part of the RAN 120b, which may include other base stations, elements, and/or devices. Each base station 170a-170b operates to transmit and/or receive wireless signals within a particular geographic region or area, sometimes referred to as a "cell" or "coverage area". A cell may be further divided into cell sectors, and a base station 170a-170b may, for example, employ multiple transceivers to provide service to multiple sectors. In some embodiments there may be established pico or femto cells where they are supported by the radio access technology. In some embodiments, multiple transceivers could be used for each cell, for example using multiple-input multiple-output (MIMO) technology having multiple transceivers for each cell. The number of RAN 120a-120b shown is an example only. Any number of RAN may be contemplated when devising the communication system 100.

The base stations 170a-170b communicate with one or more of the EDs 110a-110c over one or more air interfaces 190 using wireless communication links e.g. radio frequency (RF), microwave, infrared (IR), etc. The air interfaces 190 may utilize any suitable radio access technology. For example, the communication system 100 may implement one or more channel access methods, such as code division multiple access (CDMA), time division multiple access (TDMA), frequency division multiple access (FDMA), orthogonal frequency division multiple access (OFDMA), or single-carrier FDMA (SC-FDMA) in the air interfaces 190.

A base station 170a-170b may implement Universal Mobile Telecommunication System (UMTS) Terrestrial Radio Access (UTRA) to establish an air interface 190 using wideband CDMA (WCDMA). In doing so, the base station 170a-170b may implement protocols such as HSPA, HSPA+ optionally including HSDPA, HSUPA or both. Alternatively, a base station 170a-170b may establish an air interface 190 with Evolved UTMS Terrestrial Radio Access (E-UTRA) using LTE, LTE-A, and/or LTE-B. It is contemplated that the system 100 may use multiple channel access functionality, including such schemes as described above. In particular embodiments, the base stations and EDs implement LTE, LTE-A, and/or LTE-B. Other radio technologies for implementing air interfaces include IEEE 802.11, 802.15, 802.16, CDMA2000, CDMA2000 1×, CDMA2000 EV-DO, IS-2000, IS-95, IS-856, GSM, EDGE, and GERAN. Of course, other multiple access schemes and wireless protocols may be utilized.

The RANs 120a-120b are in communication with the core network 130 to provide the EDs 110a-110c with various services such as voice, data, application, Voice over Internet Protocol (VoIP), or other services. The RANs 120a-120b and/or the core network 130 may be in direct or indirect communication with one or more other RANs (not shown), which may or may not be directly served by core network 130, and may or may not employ the same radio access technology as RAN 120a, RAN 120b or both. The core network 130 may also serve as a gateway access between (i) the RANs 120a-120b or EDs 110a-110c or both, and (ii) other networks (such as the PSTN 140, the internet 150, and the other networks 160). In addition, some or all of the EDs 110a-110c may include functionality for communicating with different wireless networks over different wireless links using different wireless technologies and/or protocols. Instead of wireless communication (or in addition thereto), the EDs 110a-110c may communicate via wired communication channels to a service provider or switch (not shown), and to the internet 150. PSTN 140 may include circuit switched telephone networks for providing plain old telephone service (POTS). Internet 150 may include a network of computers and subnets (intranets) or both, and incorporate protocols, such as IP, TCP, UDP. EDs 110a-110c may be multimode devices capable of operation according to multiple radio access technologies, and incorporate multiple transceivers to support multiple radio access technologies.

Although FIG. 1 illustrates one example of a communication system, various changes may be made to FIG. 1. For example, the communication system 100 could include any number of EDs, base stations, networks, or other components in any suitable configuration.

Figure 2A:
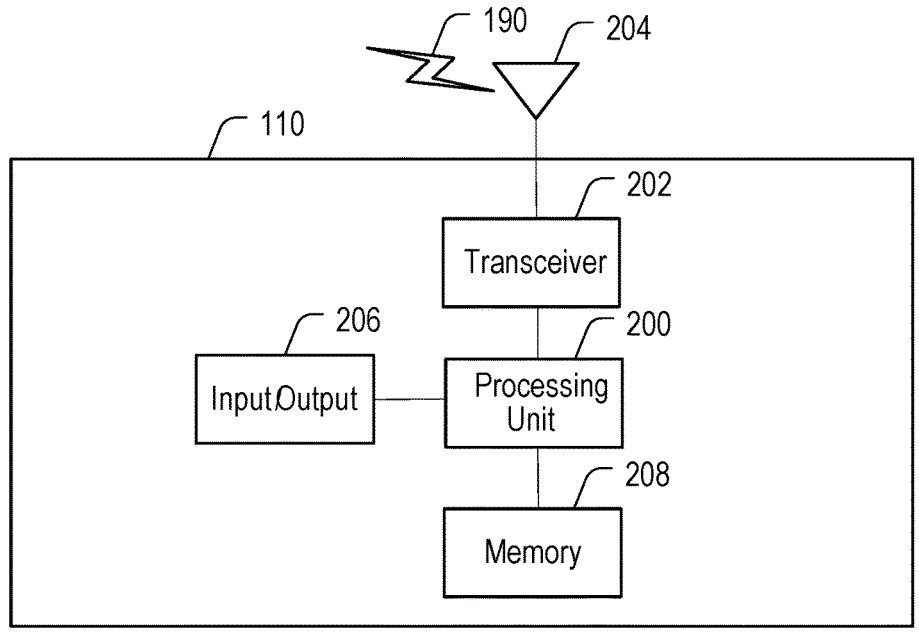
FIG. 2A illustrates an example Electronic Device (ED) structure according to FIG. 1.
Figure 2B:
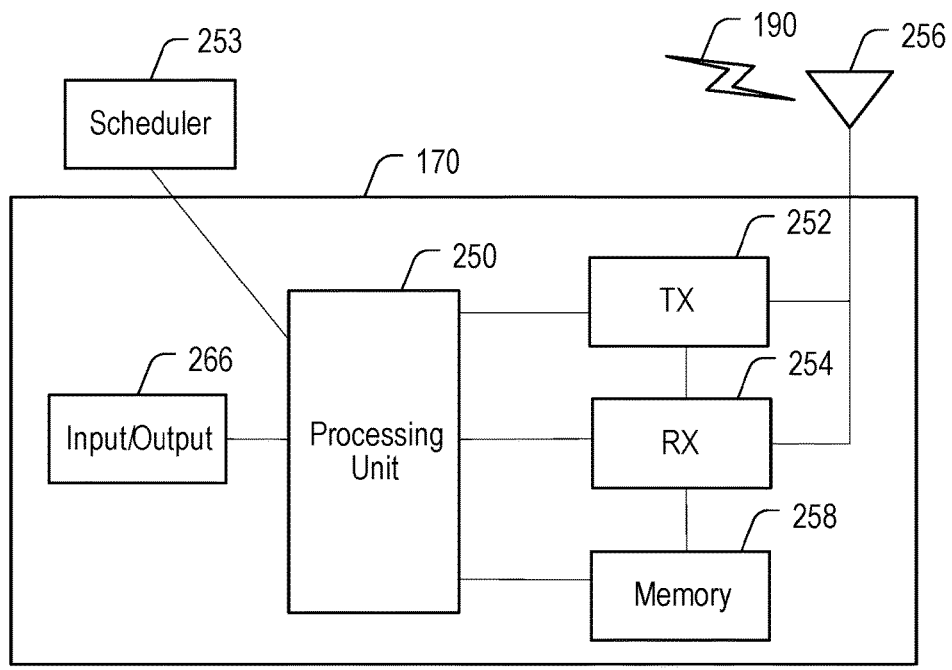
FIG. 2B illustrates an example base station structure according to FIG. 1.

FIGS. 2A and 2B illustrate example devices that may implement the methods and teachings according to this disclosure. In particular, FIG. 2A illustrates an example ED 110, and FIG. 2B illustrates an example base station 170. These components could be used in the system 100 or in any other suitable system.

As shown in FIG. 2A, the ED 110 includes at least one processing unit 200. The processing unit 200 implements various processing operations of the ED 110. For example, the processing unit 200 could perform signal coding, data processing, power control, input/output processing, or any other functionality enabling the ED 110 to operate in the communication system 100. The processing unit 200 also supports the methods and teachings described in more detail above or elsewhere herein. For example, the processing unit 200 may also be configured to implement some or all of the functionality and/or embodiments described in more detail above or elsewhere herein. Each processing unit 200 includes any suitable processing or computing device configured to perform one or more operations. Each processing unit 200 could, for example, include a microprocessor, microcontroller, digital signal processor, field programmable gate array, or application specific integrated circuit.

The ED 110 also includes at least one transceiver 202. The transceiver 202 is configured to modulate data or other content for transmission by at least one antenna or Network Interface Controller (NIC) 204. The transceiver 202 is also configured to demodulate data or other content received by the at least one antenna 204. Each transceiver 202 includes any suitable structure for generating signals for wireless or wired transmission and/or processing signals received wirelessly or by wire. Each antenna 204 includes any suitable structure for transmitting and/or receiving wireless or wired signals. One or multiple transceivers 202 could be used in the ED 110, and one or multiple antennas 204 could be used in the ED 110. Although shown as a single functional unit, a transceiver 202 could also be implemented using at least one transmitter and at least one separate receiver.

The ED 110 further includes one or more input/output devices 206 or interfaces (such as a wired interface to the internet 150). The input/output devices 206 facilitate interaction with a user or other devices (network communications) in the network. Each input/output device 206 includes any suitable structure for providing information to or receiving/providing information from a user, such as a speaker, microphone, keypad, keyboard, display, or touch screen, including network interface communications.

In addition, the ED 110 includes at least one memory 208. The memory 208 stores instructions and data used, generated, or collected by the ED 110. For example, the memory 208 could store software or firmware instructions or modules configured to implement some or all of the functionality and/or embodiments described above or elsewhere herein and that are executed by the processing unit(s) 200, and data used to reduce or eliminate interference in incoming signals. Each memory 208 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 2B, the base station 170 includes at least one processing unit 250, at least one transmitter 252, at least one receiver 254 (and/or at least one transceiver which includes functionality for a transmitter and a receiver), one or more antennas 256, at least one memory 258, and one or more input/output devices or interfaces 266. A scheduler 253, which would be understood by one skilled in the art, could also be coupled to the processing unit 250. The scheduler 253 could be included within or operated separately from the base station 170. The processing unit 250 implements various processing operations of the base station 170, such as signal coding, data processing, power control, input/output processing, or any other functionality. The processing unit 250 can also support the methods and teachings described in more detail above or elsewhere herein. For example, the processing unit 250 could be configured to implement some or all of the functionality and/or embodiments described in more detail above or elsewhere herein. Each processing unit 250 includes any suitable processing or computing device configured to perform one or more operations. Each processing unit 250 could, for example, include a microprocessor, microcontroller, digital signal processor, field programmable gate array, or application specific integrated circuit.

Each transmitter 252 includes any suitable structure for generating signals for wireless or wired transmission to one or more EDs or other devices. Each receiver 254 includes any suitable structure for processing signals received wirelessly or by wire from one or more EDs or other devices. Although shown as separate components, at least one transmitter 252 and at least one receiver 254 could be combined into a transceiver. Each such transceiver includes any suitable structure for generating signals for wireless or wired transmission to one or more EDs or other devices. Each transceiver further includes any suitable structure for processing signals received wirelessly or by wire from one or more EDs or other devices.

Each antenna 256 includes any suitable structure for transmitting and/or receiving wireless or wired signals. Although a common antenna 256 is shown here as being coupled to both the transmitter 252 and the receiver 254, one or more antennas 256 could be coupled to the transmitter(s) 252, and one or more separate antennas 256 could be coupled to the receiver(s) 254. Similarly, a common antenna 256 as shown here could be coupled to a transceiver, or one or more antennas could be coupled to the transceiver(s).

Each memory 258 includes any suitable volatile and/or non-volatile storage and retrieval device(s) such as those described above in connection to the ED 110. The memory 258 stores instructions and data used, generated, or collected by the base station 170. For example, the memory 258 could store software instructions or modules configured to implement some or all of the functionality and/or embodiments described above and that are executed by the processing unit(s) 250.

Each input/output device 266 facilitates or permits interaction with a user or other devices (network communications) in the network. Each input/output device 266 includes any suitable structure for providing information to or receiving/providing information from a user, including network interface communications.

The communication system in FIG. 1 and the example ED and base station in FIGS. 2A and 2B represent examples of systems or apparatus in which embodiments disclosed herein could be implemented. Example embodiments will now be described in further detail.

Figure 3A:
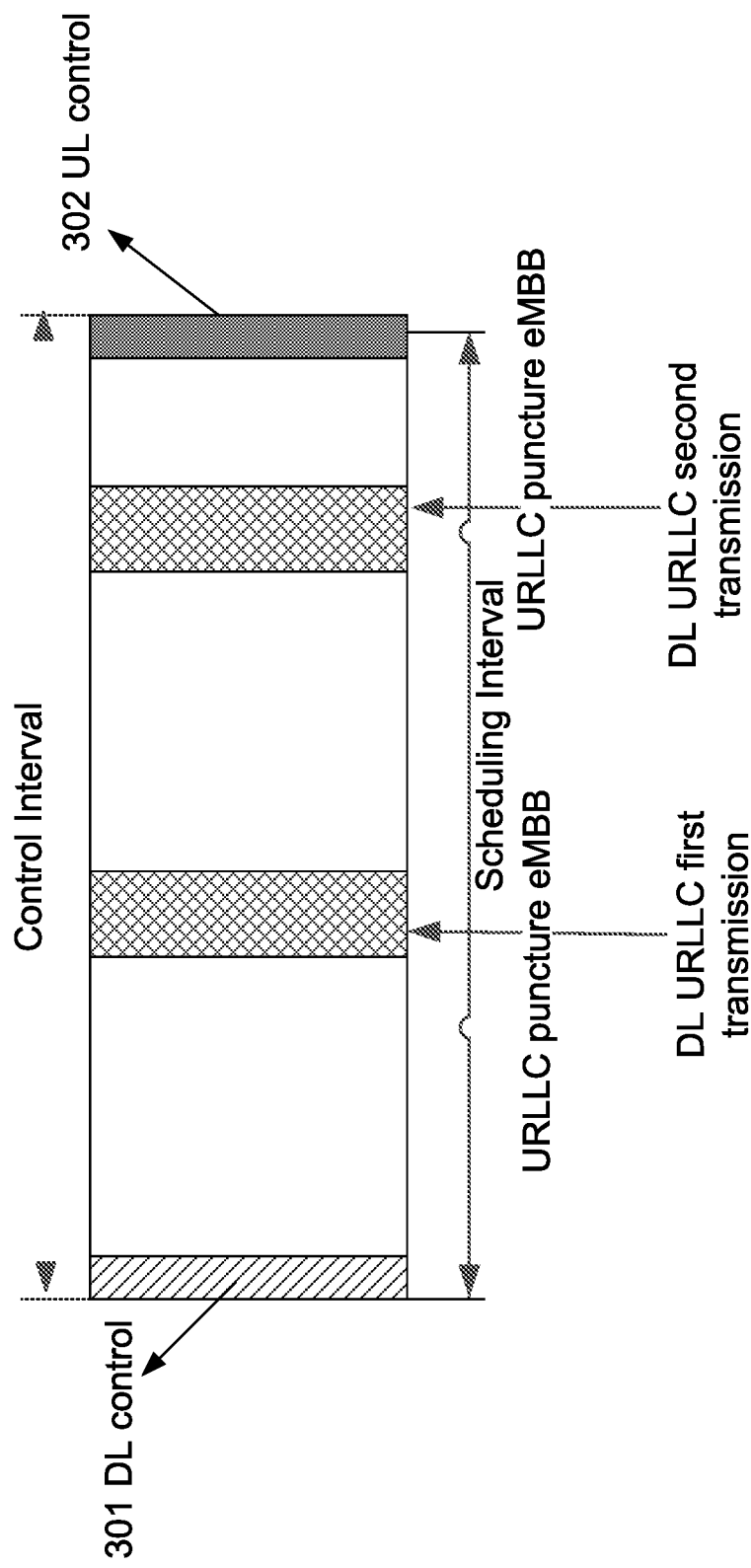
FIG. 3A illustrates a coexistence scenario of eMBB and URLLC.

One embodiment provides a scenario of the coexistence of eMBB and URLLC shown in FIG. 3A. URLLC services should use short transmission duration to meet the latency requirement, and eMBB services should use long transmission duration to maximize system capacity. The dynamic multiplexing of eMBB and URLLC services can use both FDM and TDM over the system bandwidth. In order to support dynamic multiplexing between eMBB and URLLC multiplexing, a bursty puncturing/error recovery scheme may be in place to recover the punctured part of eMBB that is punctured as shown in FIG. 3A for URLLC multiplexing, as shown. DL and UL control are also shown, at 301, 302, respectively.

Figure 3B:
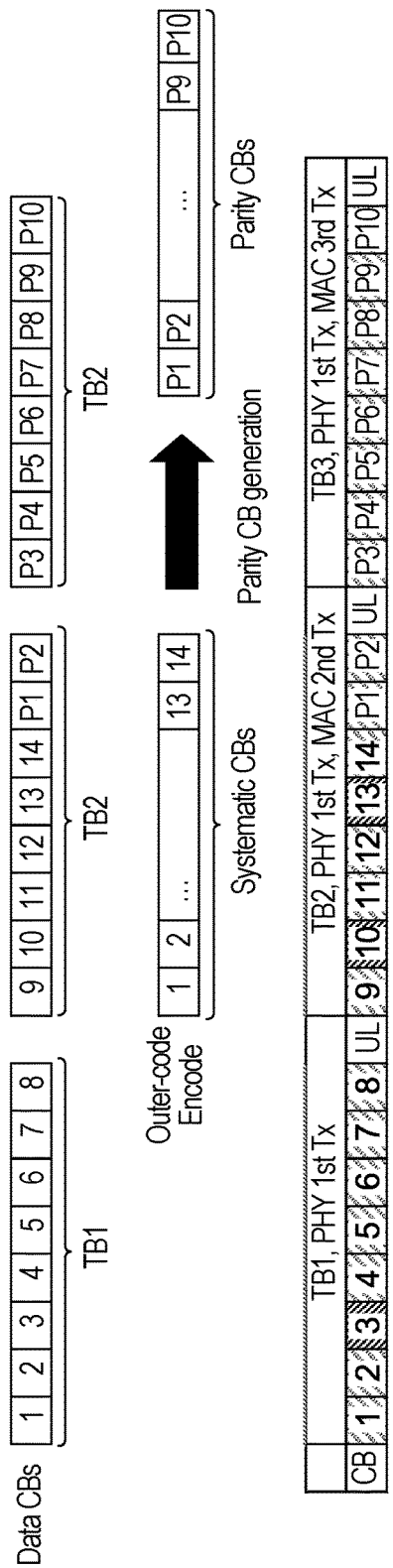
FIG. 3B illustrate a outer code based on H-ARQ feedback.

One technique to solve the bursty puncturing/error recovery scheme adopts an outer erasure code (herein called an outer code) to do retransmission, which is shown in FIG. 3B. In the example, code blocks (CBs) 3, 10, and 13 are not correctly decoded. After receiving a H-ARQ request, instead of retransmitting redundant versions for CB 1-14, the transmitter transmits the outer code parity check CBs (PBs) P1-P10. If more than three PBs can be correctly received, then from the CB {1-2, 4-8, 9, 11-12, 14}, and the correctly received PBs, the receiver will be able to recover all the desired CBs 1-14.

A potential advantage of this approach is that the receiver does not need to tell the transmitter which CB(s) were not successfully decoded, and the CBs are still able to share the same H-ARQ process. In other words, the transmitter simply transmits the PB(s) after knowing that the TB was not successfully decoded. The receiver will be able to recover the unsuccessfully decoded CBs, by knowing which CBs were unsuccessfully decoded, and by using the newly received PB(s).

Figure 3C:
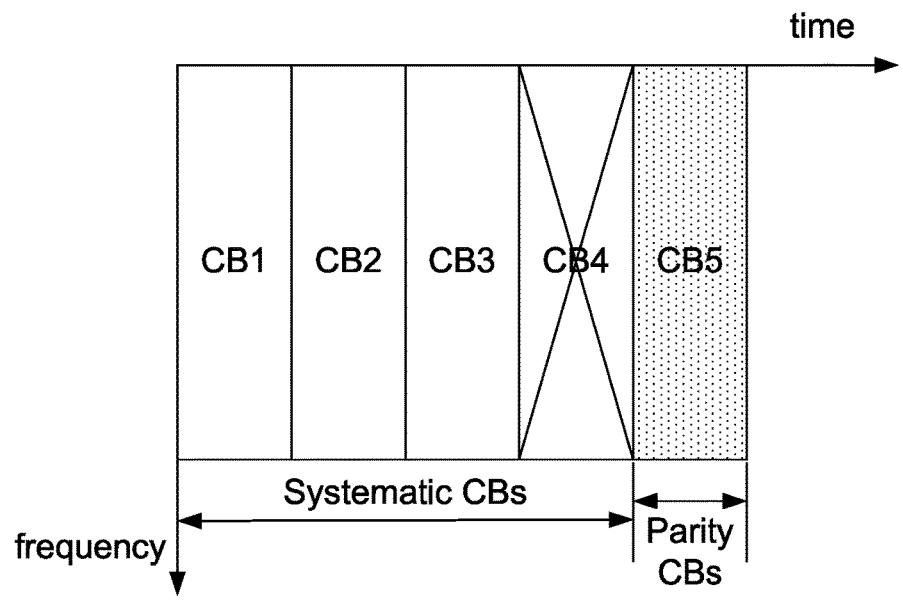
FIGS. 3C and 3D illustrate a single parity check based outer erasure code for bursty puncturing recovery.

One application of outer codes is in puncturing an eMBB TB with URLLC signals, when the eMBB receiver does not know that the URLLC signals were actually not intended for the eMBB receiver. In that case, decoding the eMBB TB will fail, because combining redundant versions of the failed CBs with the CBs that are not intended for the receiver (and hence are interferences in this sense) will not succeed in recovering the original eMBB data. In that case, outer codes could be especially useful. One embodiment provides single parity check CB as a redundant version of outer codes. The single parity check CB is encoded across all data code blocks of a TB and generates a parity code block which could protect data code blocks from bursty interference and/or puncturing. One key here is that each CB is protected by PHY coding (LDPC/Turbo/Polar) and some error detection overhead such as CRC (as needed). Whenever one CB decoding fails, these bits are treated as known to be erased instead of code bit errors that are unknown. Based on the PHY coding/CRC, which marks the erased CB location, erasure decoding could be used to recover these failed CBs. One example of outer erasure code based on single parity check code is shown in FIG. 3C.

Encoding of single parity check code, according to an embodiment, is described below.

In a parity check code block scheme, assuming that a TB is divided into m CBs of equal length k, the $i^{th}$ CB is denoted as $\{c_{i,0}, c_{i,1}, \ldots, c_{i,k-1}\}$. The PB $\{p_{1,0}, p_{1,1}, \ldots, p_{1,k-1}\}$ is obtained as $$p_{1,l} = c_{1,l} \oplus c_{2,l} \oplus \ldots \oplus c_{m,l}, \quad (1)$$

where $\oplus$ indicates an XOR operation. The PB $\{p_{1,0}, p_{1,1}, \ldots, p_{1,k-1}\}$ is then FEC encoded and transmitted. For example, the FEC can be LDPC, Turbo or Polar. The receiver receives the FEC coded PB $\{p_{1,0}, p_{1,1}, \ldots, p_{1,5-1}\}$, and decodes it. If the $i^{th}$ CB is not successfully decoded, for example the CB4 is not successfully decoded in FIG. 3C, but $\{p_{1,0}, p_{1,1}, \ldots, p_{1,k-1}\}$ is correctly received, the $i^{th}$ CB can be recovered as $$c_{i,l} = c_{1,l} \oplus c_{2,l} \oplus \ldots \oplus c_{i-1,l} \oplus c_{i+1,l} \oplus \ldots \oplus c_{m,l} \oplus p_{1,l}. \quad (2)$$

Figure 3D:
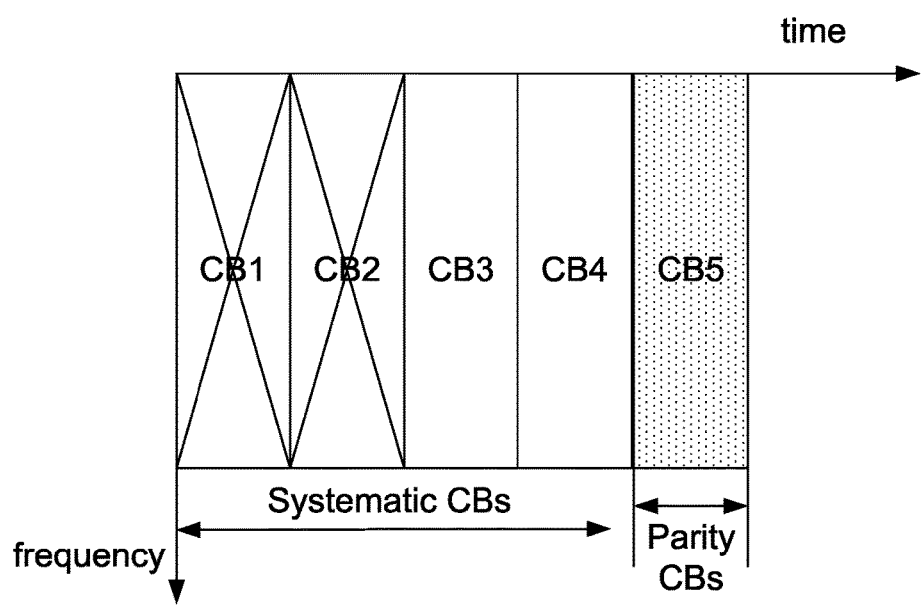

The above single parity check code method is performed with a simple XOR operation. However, there is a limitation that a parity check CB can only provide for error correction of one additional CB, which sometimes may not be enough. For example, if 2 CBs in a TB are unsuccessfully decoded as shown in FIG. 3D, the 2 CBs cannot be correctly decoded using the single parity check code method. In this situation, other outer erasure codes, for example Hamming codes, could correct up to 2 CB erasures.

In addition to a parity check CB, a Reed-Solomon code could also be used as an outer code. The Reed-Solomon code has a shortcoming in that it needs to know in advance how many redundant versions need to be transmitted, and in addition, the Reed-Solomon code has a limitation in code parameters, e.g. its block length $n=p^m-1$, where p is a prime number, and m is an integer. Also, shortened Reed-Solomon codes are usually less efficient than parity check codes.

In order to solve the problem of unsuccessfully decoding CBs, one embodiment provides a new method which uses a shifted version of parity check CB as outer codes, in which the first data retransmission uses the single parity check CB, and the second data retransmission uses a shifted parity check CB. The receiver can correctly decode the CBs, and also decoding using more than one parity check CB can be done with reduced complexity.

Figure 4:
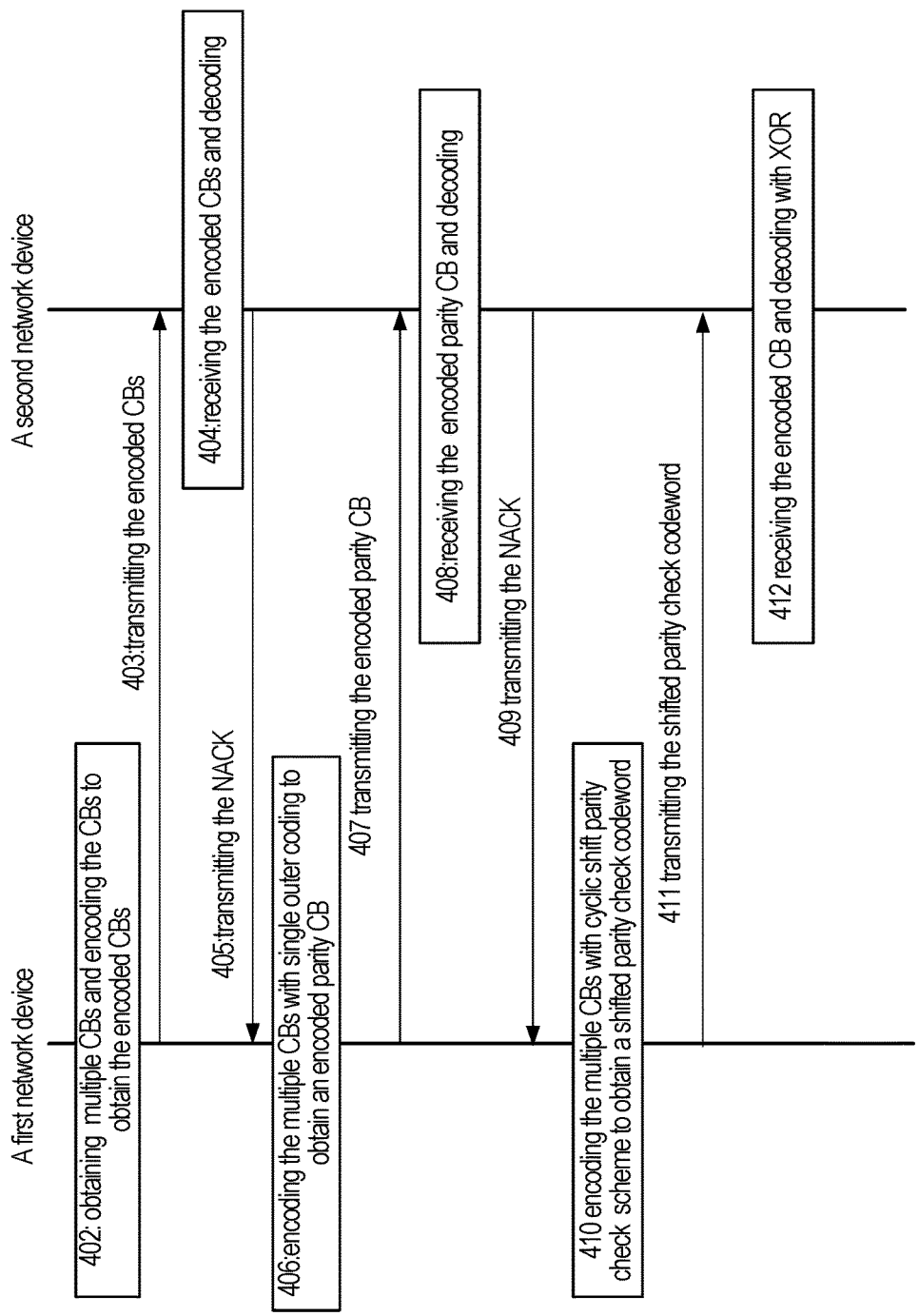
FIG. 4 illustrates is a flowchart of a method performed using outer coding.

FIG. 4 shows a flowchart illustration of encoding and decoding in more detail, and one embodiment provides a new method of outer coding the CBs with one or more shifted parity check CBs as described below.

In the step 402, the first network device obtains multiple CBs. For example, if the first network device has a relatively large data TB in an eMBB scenario, then the first network device could divide the TB into multiple CBs. If the first network device has multiple small packets in an URLLC scenario, then the first network device could combine the multiple small data into one or multiple CBs. In some embodiments, with coexistence of eMBB and URLLC for example, generation of CBs could involve both dividing larger data blocks such as eMBB TBs among multiple CBs and combining smaller data blocks such as URLLC packets into CBs.

Here the first network device can be a network side node, such as RANs 120a-120b in FIG. 1. Alternatively, the first network device could be an ED 110a-110c in FIG. 1. The second network device could similarly be a network side node or an ED. In the step 402, the first network device encodes the multiple CBs to obtain the encoded CBs, shown by way of example as CBs A in FIG. 5. The encoding scheme can use Polar coding, LDPC coding or Turbo coding, for example, which can be flexibly selected according to the different service scenarios and/or other parameters.

In the step 403, the first network device 403 transmits the encoded codeword(s) to the second network device. The second network device receives the encoded codeword(s) and decodes the encoded codeword(s) in step 404. If the second network device fails to correctly decode the received codeword(s), the second network device performs the step 405 to send a NACK indicating the failure of decoding.

In the step 406, the first network device encodes the multiple CBs with a parity check code block scheme, which can be referred to as a single outer coder, such as the scheme disclosed in the above equations (1) and (2). Consider the CBs B in FIG. 5 as an example, assuming that a TB is divided into 4 CBs of equal length 4. The first CB1 is denoted as $\{c_{1,0}, c_{1,1}, c_{1,2}, c_{1,3},\}$, the second CB2 is denoted as $\{c_{2,0}, c_{2,1}, c_{2,2}, c_{2,3}\}$, the third CB3 is denoted as $\{c_{3,0}, c_{3,1}, c_{3,2}, c_{3,3}\}$, and the fourth CB4 is denoted as $\{c_{4,0}, c_{4,1}, c_{4,2}, c_{4,3},\}$ in FIG. 5. In order to avoid congestion in FIG. 5, the notation in the drawing does not include commas between the "c" and "p" indices, but the notations with and without commas are equivalent. The first network device performs a parity check code block scheme. The first network device performs an XOR operation for CBs 1 to 4 to obtain a parity check CB5, also denoted as PB5 $\{p_{1,0}, p_{1,1}, p_{1,2} p_{1,3}\}$, which is obtained as the equation (3) below:

$$p_{1,i}=c_{1,i}\oplus c_{2,i}\oplus c_{3,i}\oplus c_{4,i}, i=1,\ldots,4, \quad (3)$$

In above equation (3), the symbol indicates an XOR operation. The parity check CB5 $\{p_{1,0}, p_{1,1}, p_{1,2}, p_{1,3}\}$ is encoded by FEC coding to obtain an encoded parity codeword. In the step 407, the first network device transmits the encoded parity codeword.

In the step 408, the second network device receives the encoded parity codeword and performs decoding. If a CB is unsuccessfully decoded, for example if the CB4 is unsuccessfully decoded as shown in FIG. 3C, but the parity check CB $\{p_{1,0}, p_{1,1}, \ldots, p_{1,k-1}\}$ is correctly received, the CB4 can be recovered as:

$$c_{i,l}=c_{1,l}\oplus c_{2,l}\oplus \ldots \oplus c_{i-1,l}\oplus c_{i+1,l}\oplus \ldots \oplus c_{m,l}\oplus p_{1,l}. \quad (4)$$

If 2 CBs are unsuccessfully decoded, for example the CB1 and CB2 are unsuccessfully decoded as shown in FIG. 3D, the second network device can correctly decode the CB3 and CB4 and then perform the XOR operation to remove the codewords of CB3 and CB4. That is, an XOR with CBs that are correctly decoded from received codeword(s) is equivalent to removing the effect of the correctly decoded codeword(s) from the received parity codeword(s). The following parity check CB, which contains parity bits for only the unsuccessfully decoded CBs, CB1 and CB2, can be obtained:

$$p_{1,0}=c_{1,0}\oplus c_{2,0}, p_{1,1}=c_{1,1}\oplus c_{2,1}, p_{1,2}=c_{1,2}\oplus c_{2,2}, p_{1,3}=c_{1,3}\oplus c_{2,3}. \quad (5)$$

The encoded parity check CB $\{p_{1,0}, p_{1,1}, \ldots, p_{1,k-1}\}$ cannot correctly decode two failed CBs based on the above equation (5). The second network device performs the step 409 to send a NACK indicating the decoding failure.

The first network device receives the NACK and performs the step 410, encoding the multiple CBs with a cyclic shift parity check scheme. The cyclic shift parity check scheme can be a right cyclic shift of a code block, a left cyclic shift of a code block, or a random direction cyclic shift of a code block. In summary, the encoded CB after performing the shifted parity check scheme has a different parity check code than the single parity check code disclosed in FIG. 3C.

Figure 5:
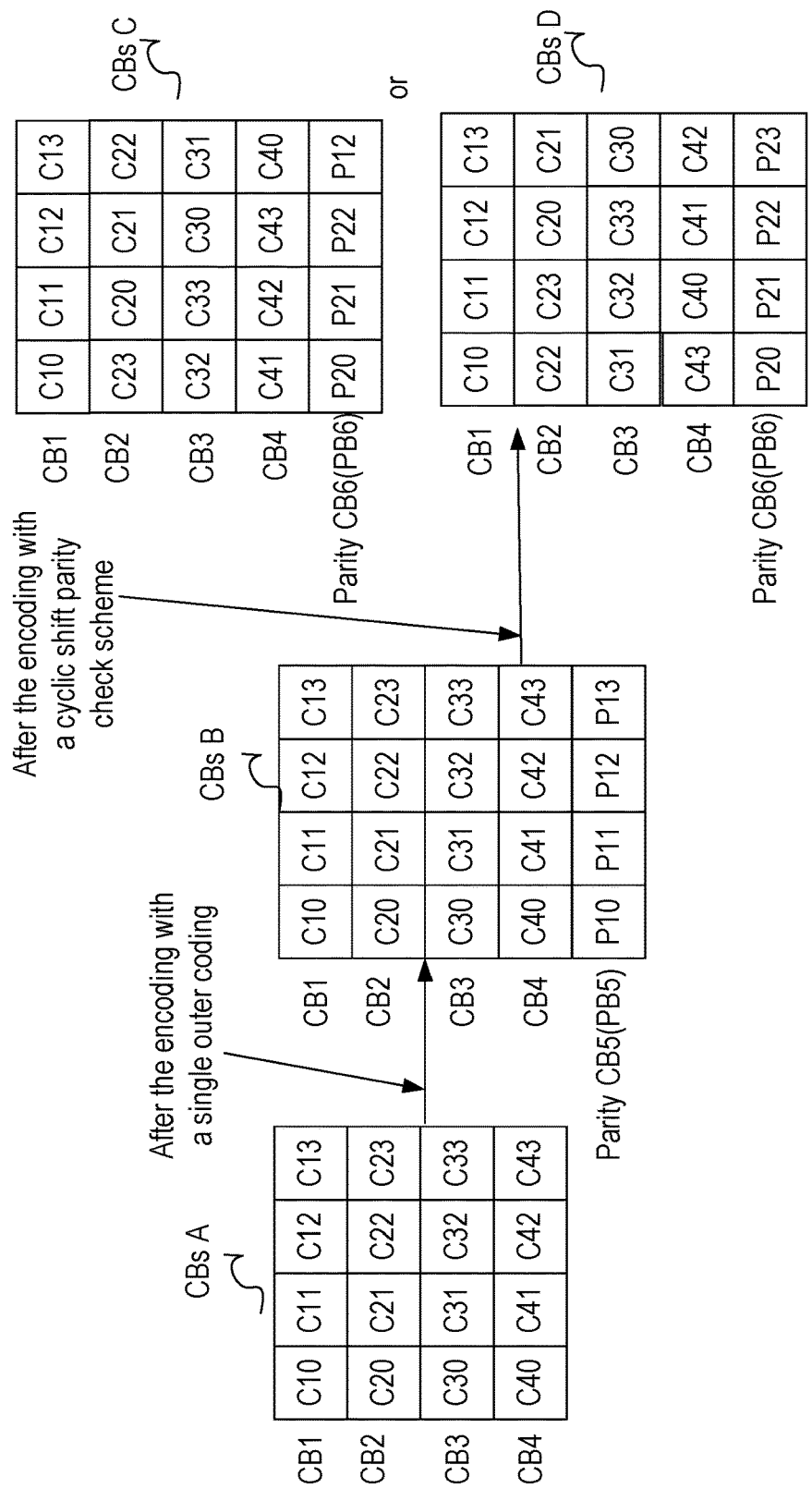
FIG. 5 illustrates an encoding example based on an encoding scheme of embodiments disclosed herein.

FIG. 5 shows the different examples of cyclic shift to obtain a shifted parity check CB. In a parity check code block scheme with cyclic shift, assume that a TB is divided into m CBs of equal length k, for example the value of m is 4 in FIG. 5. CBs A are the original 4 CBs 1 to 4. After the operation of a cyclic shift, the first network device obtains the shifted parity check CBs shown by way of example as CBs C, wherein the first CB1 does not perform a cyclic shift; the second CB2 performs a right cyclic shift, with the cyclic shifting value 1; the third CB3 performs a right cyclic shift, with the cyclic shifting value 2; and the fourth CB4 performs a right cyclic shift, with the cyclic shifting value 3. In an alternative aspect, after the operation of a cyclic shift, the first network device obtains the shifted parity check CBs D, wherein the first CB1 does not perform a cyclic shift; the second CB2 performs a right cyclic shift, with the cyclic shifting value 2; the third CB3 performs a right cyclic shift, with the cyclic shifting value 3, and the fourth CB4 performs a right cyclic shift, with the cyclic shifting value 1. After the operation(s) of cyclic shift to obtain the CBs C and/or the CBs D, the first network device performs an XOR operation to obtain either or both of the shifted parity check CBs that are labeled as CB6 and PB6 in FIG. 5.

FIG. 5 only shows 2 examples of CBs 2 to 4 as a result of performing a right cyclic shift. In one aspect of the embodiment, the first network device can perform a left cyclic shift, or a combination of left and right cyclic shifts for different CBs. The cyclic shifting value can be fixed, for example 1 or N, wherein N is less than k/2.

In one embodiment, taking the right cyclic shift of a code block with the cyclic shifting value of 1 as an example, this could be denoted as a code block $\vec{\tilde{c}}_i^{(i-1)}$ being the $(i-1)^{th}$ right cyclic shift of code block $\vec{c}_i$, wherein $\vec{c}_i$ is $\{c_{i,0}, c_{i,1}, \ldots, c_{i,k-1}\}$, and k is the length of the information bits $\{c_{i,0}, c_{i,1}, \ldots, c_{i,k-1}\}$ in a code block. A shifted parity check CB $\vec{p}_2$ can be obtained as:

$$p_{2,l}=\tilde{c}_{1,l}^{(0)}\oplus \tilde{c}_{2,l}^{(1)}\oplus \ldots \oplus \tilde{c}_{m,l}^{(m-1)} \quad (6)$$

In above equation (6), the symbol $\oplus$ indicates an XOR operation. The parity check CB6 $\{p_{1,0}, p_{1,1}, p_{1,2}, p_{1,3}\}$ is encoded by FEC coding to obtain an encoded shifted parity codeword. In the step 411, the first network device transmits the above encoded shifted parity check codeword. In the receiving side, after the second network device receives encoded shifted parity codeword, the second network node performs the decoding process. In the step 412, the decoding process is an iterative XOR operation, described as follows. Without losing generality, in some embodiments the number of CBs is much smaller than the code block length k. In the example described below, it is assumed that k=4, and CB1 and CB2 were not successfully decoded as shown in FIG. 3D.

In the step 412: the second network device receives the shifted parity check CB $\vec{p}_2$. After the second network device receives and decodes the cyclic shift encoded parity codeword(s), the second network device can correctly decode the CB1 and CB2 based on performing an XOR operation to remove the shifted codewords of CB3 and CB4. As noted above, an XOR with correctly decoded codeword(s) is equivalent to removing the effect of the correctly decoded codeword(s) from the received parity codeword(s), and obtains the following parity check CB, which contains only the unsuccessfully decoded code blocks CB1 and CB2, $$p_{2,0}=c_{1,0}\oplus c_{2,1}, p_{2,1}=c_{1,1}\oplus c_{2,2}, p_{2,2}=c_{1,2}\oplus c_{2,3}, p_{2,3}=c_{1,3}\oplus c_{2,0}. \quad (7)$$

By setting $c_{1,0}=0$, equation (8) follows.

$$c_{2,0}=p_{1,0}\oplus c_{1,0}, c_{2,1}=p_{2,0}\oplus c_{1,0}, c_{1,1}=p_{1,1}\oplus c_{2,1}, c_{2,2}=p_{2,1}\oplus c_{1,1},$$

$$c_{1,2}=p_{1,2}\oplus c_{2,2}, c_{2,3}=p_{2,2}\oplus c_{1,2}, c_{1,3}=p_{1,3}\oplus c_{2,3}. \quad (8)$$

The second network device obtains the decoded CB1 and CB2, and performs a CRC check on each CB. In an embodiment, if the CRC fails, the second network device flips the CB1 and CB2. The flip operation could be to perform "⊕1" on every decoded bit. In another equivalent process, the flip operation is to set $c_{1,0}=1$ from 0 or to set $c_{1,0}=0$ from 1. The CRC decoding is then performed again, repeating the CRC checking step. If all CBs and PBs are correctly decoded, the CRC should pass, and the resulting CB1 and CB2 are correctly decoded CBs. Here, for setting $c_{1,0}=1$ or $c_{1,0}=0$, the network can pre-configure the setting, or the first network device and the second node can dynamically select the setting.

The above URLLC puncturing, as illustrated in FIG. 3A, only happens in the DL, and URLLC is discussed as an example scenario; however, this encoding scheme can also or instead be used for H-ARQ generally, and in that sense, it is applicable to both DL and UL as well.

After the second network device successfully decodes the CBs 1 to 4, the second network device feeds back an ACK to the first network device. In an embodiment, for encoding of parity coding, one additional XOR operation is performed to generate the parity block for the first retransmission, and for encoding of shifted parity coding, one additional XOR operation is performed to generate the shifted parity block for the second retransmission. Based on this encoding scheme, the receiver should be able to decode successfully when one CB or two CBs are unsuccessfully decoded. On the other hand, in a further embodiment, in order to reduce complexity, the number of logic gates is reduced due to smaller size of each code block. Changing the number of CBs per TB could also or instead reduce the number of logic gates.

Figure 6:
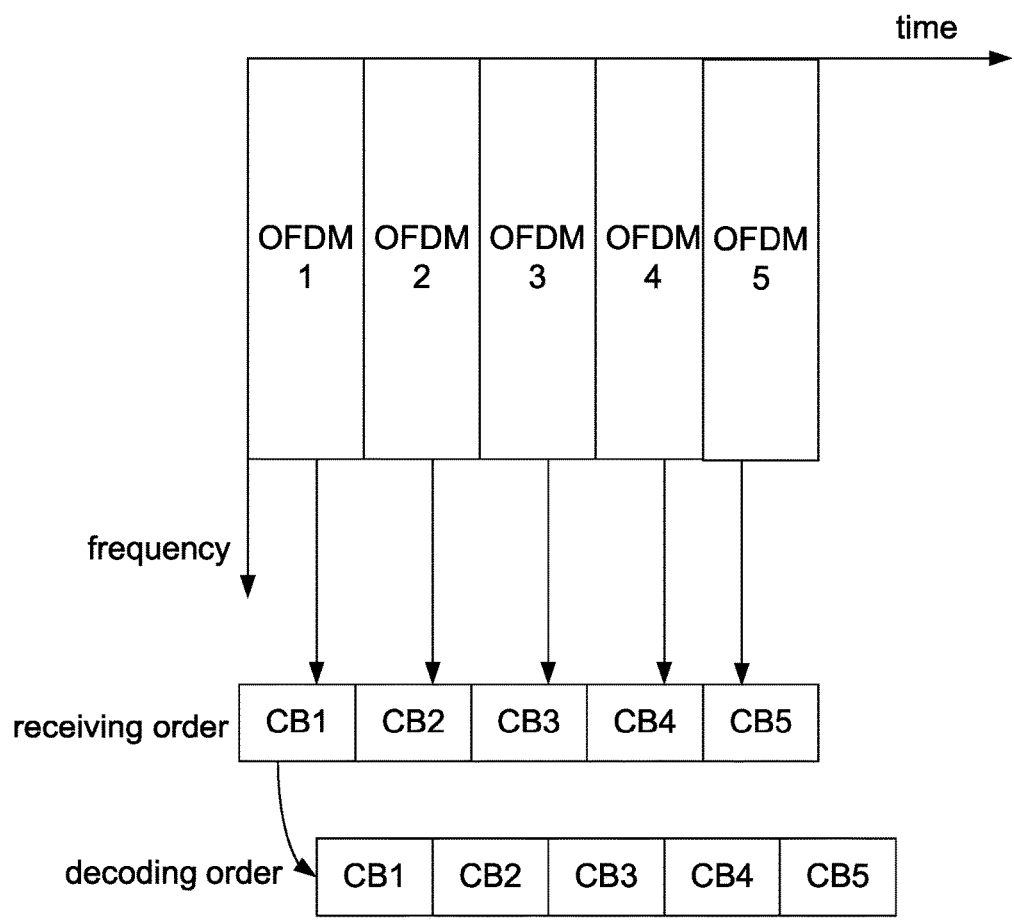
FIG. 6 illustrates On-the-fly decoding based on packet coding.

FIG. 6 shows on-the-fly decoding based on packet coding. Considering the on-the-fly decoding, hardware implementation can be simplified. For example, in conventional H-ARQ, if the fourth code block is in error, then it is necessary to wait for the receiver to receive the retransmission block for the fourth block, then combine the received data with previously received soft values stored in a "soft buffer", and then perform decoding. Disadvantages of this approach include: 1) the retransmission blocks for CB1-CB3 are of no use, but it is still necessary to wait to receive them; and 2) the receiver will maintains a soft buffer, which is more complex than simply discarding the failed block. In on-the-fly decoding as shown in FIG. 6, received code blocks are decoded in order, thereby potentially avoiding these disadvantages and simplifying hardware implementation.

Figure 7:
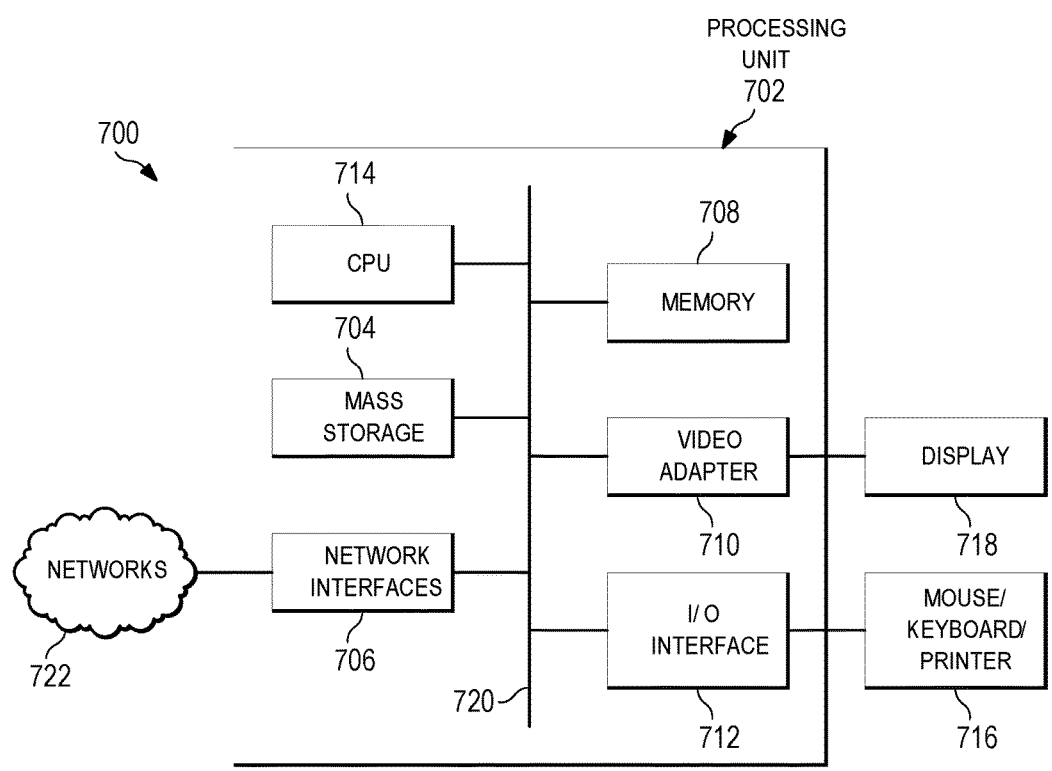
FIG. 7 is a block diagram of a computing system that may be used for implementing the devices and methods disclosed herein according to one embodiment.

FIG. 7 is a block diagram of a computing system 700 that may be used for implementing the devices and methods disclosed herein, For example, the computing system can be any entity of UE, AN, MM, SM, UPGW, AS. Specific devices may utilize all of the components shown or only a subset of the components, and levels of integration may vary from device to device. Furthermore, a device may contain multiple instances of a component, such as multiple processing units, processors, memories, transmitters, receivers, etc. The computing system 700 includes a processing unit 702. The processing unit 702 includes a central processing unit (CPU) 714, memory 708, and may further include a mass storage device 704, a video adapter 710, and an I/O interface 712 connected to a bus 720.

The bus 720 may be one or more of any type of several bus architectures including a memory bus or memory controller, a peripheral bus, or a video bus. The CPU 714 may comprise any type of electronic data processor. The memory 708 may comprise any type of non-transitory system memory such as static random access memory (SRAM), dynamic random access memory (DRAM), synchronous DRAM (SDRAM), read-only memory (ROM), or a combination thereof. In an embodiment, the memory 708 may include ROM for use at boot-up, and DRAM for program and data storage for use while executing programs.

The mass storage 704 may comprise any type of non-transitory storage device configured to store data, programs, and other information and to make the data, programs, and other information accessible via the bus 720. The mass storage 704 may comprise, for example, one or more of a solid state drive, hard disk drive, a magnetic disk drive, or an optical disk drive.

The video adapter 710 and the I/O interface 712 provide interfaces to couple external input and output devices to the processing unit 702. As illustrated, examples of input and output devices include a display 718 coupled to the video adapter 710 and a mouse/keyboard/printer 716 coupled to the I/O interface 712. Other devices may be coupled to the processing unit 702, and additional or fewer interface cards may be utilized. For example, a serial interface such as Universal Serial Bus (USB) (not shown) may be used to provide an interface for an external device.

The processing unit 702 also includes one or more network interfaces 706, which may comprise wired links, such as an Ethernet cable, and/or wireless links to access nodes or different networks. The network interfaces 706 allow the processing unit 702 to communicate with remote units via the networks. For example, the network interfaces 706 may provide wireless communication via one or more transmitters/transmit antennas and one or more receivers/receive antennas. In an embodiment, the processing unit 702 is coupled to a local-area network 722 or a wide-area network for data processing and communications with remote devices, such as other processing units, the Internet, or remote storage facilities.

It should be appreciated that one or more steps of the embodiment methods provided herein may be performed by corresponding units or modules. For example, a signal may be transmitted by a transmitting unit or a transmitting module. A signal may be received by a receiving unit or a receiving module. A signal may be processed by a processing unit or a processing module. Other steps may be performed by a establishing unit/module for establishing a serving cluster, a instantiating unit/module, an establishing unit/module for establishing a session link, an maintaining unit/module, other performing unit/module for performing the step of the above step. The respective units/modules may be hardware, software, or a combination thereof. For instance, one or more of the units/modules may be an integrated circuit, such as field programmable gate arrays (FPGAs) or application-specific integrated circuits (ASICs).

According to an example 1, a method is performed by a first network device and involves: receiving, by the first network device, a second feedback information from a second network device; wherein the second feedback information indicates decoding failure of a transport block (TB) including N coding blocks (CBs) for a second time; performing, by the first network device, a cyclic shift parity check scheme to obtain a shifted parity check CB; encoding, by the first network device, the shifted parity check CB to obtain an encoded parity check codeword; transmitting, by the first network device, the encoded parity check codeword to the second network device.

An example 2 includes the method of example 1 wherein, before the receiving step, the method further comprises: receiving, by the first network device, a first feedback information from the second network device, wherein the first feedback information indicates decoding failure of the TB for a first time; performing, by the first network device, a parity check scheme for CBs to obtain a parity check CB; encoding, by the first network device, the parity check CB to obtain an encoded parity codeword.

An example 3 includes the method of any one of examples 1 and 2, wherein performing a cyclic shift parity check scheme comprises: performing, by the first network device, a cyclic shift operation for each CB; performing, by the first network device, an XOR operation for N CBs to obtain a shifted parity check CB.

An example 4 includes the method of example 3, wherein the performing the cyclic shift operation comprises: performing, by the first network device, an $(i-1)^{th}$ cyclic shift of CBs to obtain a CB $\vec{c}_i$, wherein $\vec{c}_i$ is $\{c_{i,0}, c_{i,1}, \ldots, c_{i,k-1}\}$, and k is the length of the information bits $c_{i,0}, c_{i,1}, \ldots, c_{i,k-1}$ in the CB.

An example 5 includes the method of example 4, wherein the method further comprises: performing an XOR operation to obtain a shifted parity check CB $\vec{p}_2$, wherein the $\vec{p}_2$ is $p_{2,l} = \tilde{c}_{1,l}^{(0)} \oplus \tilde{c}_{2,l}^{(1)} \oplus \ldots \oplus \tilde{c}_{m,l}^{(m-1)}$, m is the number of CBs.

An example 6 includes the method of example 2, wherein the method further comprises: performing, by the first network device, an XOR operation for CBs to obtain a parity codeword.

An example 7 includes the method of any one of the examples 1 to 6, wherein the first network device is a UE, and the second network device is a base station; or the first network device is a base station, and the second network device is a UE.

According to an example 8, a first network device includes: a processor; and a computer readable storage medium storing programming for execution by the processor, the programming including instructions to perform actions in accordance with a method in any one of examples 1 to 7.

According to an example 9, a method performed by a second network device involves: sending, by the second network device, a second feedback information to a first network device; wherein the second feedback information indicates decoding failure of a transport block (TB) including N coding blocks (CBs) for a second time; receiving, by the second network device, an encoded parity check codeword from the first network device; wherein the encoded parity check codeword is obtained according to a cyclic shift parity check scheme; decoding, by the second network device, the encoded parity check codeword.

An example 10 includes the method of example 9, wherein the cyclic shift parity check scheme is obtained by performing a cyclic shift operation for each CB and performing an XOR operation for N CBs to obtain a shifted parity check CB.

An example 11 includes the method of any one of examples 9 and 10, wherein the decoding operation comprises: performing, by the second network device, a series of XOR operations to remove successfully decoded CBs; setting $c_{i,0}=0$ or $c_{i,0}=1$, where i is a code block index of one of the failed code blocks; performing, by the second network device, a series of XOR operations to recover the failed code blocks.

According to an example 12, a second network device includes: a processor; and a computer readable storage medium storing programming for execution by the processor, the programming including instructions to perform actions in accordance with a method in any one of examples 9 to 11.

The embodiments described above are intended as illustrative examples. Other embodiments are also contemplated.

Figure 8:
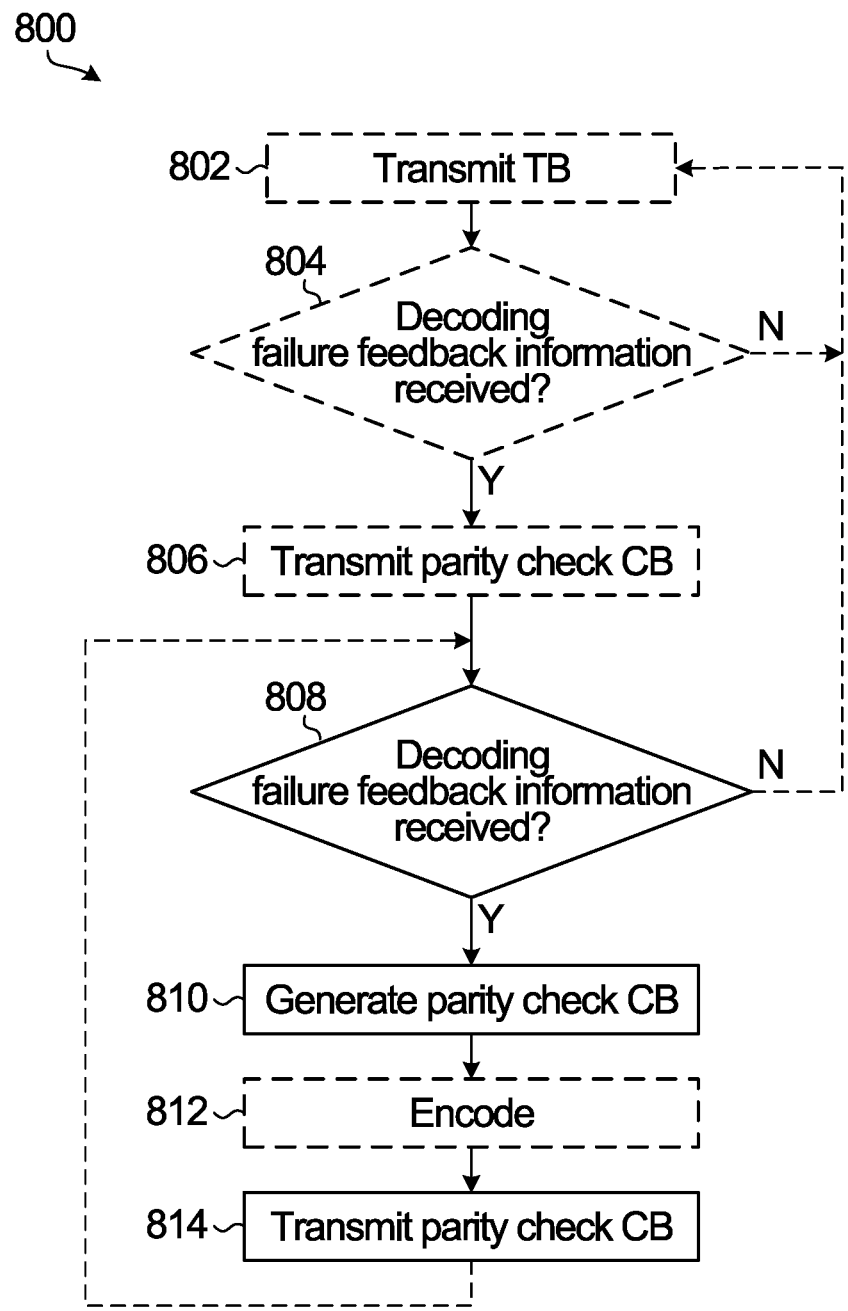
FIG. 8 is a flow diagram illustrating an example transmit-side method according to another embodiment.

FIG. 8, for example, is a flow diagram illustrating a transmit-side method according to another embodiment. As shown, the method 800 could involve transmitting a TB, which includes a number m of CBs, from a first network device to a second network device at 802. One or multiple TBs could be transmitted at 802. At 804, it is determined by the first network device whether feedback information indicative of a decoding failure is received from the second network device. If not, then further TBs could be transmitted at 802, or the method could end and subsequently be performed again when additional CBs are to be transmitted.

At 806, after a first decoding failure in the example shown, a parity check CB is transmitted. The parity check CB is based on contents of the TB. A parity check scheme to generate the parity check CB could involve performing an XOR operation for the CBs to obtain the parity check CB, for example.

In an embodiment, the parity check CB is first encoded, by FEC encoding for example, to obtain an encoded parity check codeword, and the encoded parity check codeword is transmitted at 806.

In FIG. 8, the TB and parity check CB are transmitted separately at 802, 806. In another embodiment, the TB and parity check CB could be transmitted together. A parity check CB could be transmitted without necessarily first receiving decoding failure feedback information at 804.

The example method 800 also involves, at 808, determining whether decoding failure feedback information, which indicates a decoding failure of a TB, is received. Such a decoding failure in this example is detected by a receiver or decoder based on the parity check CB that is transmitted at 806. Non-receipt of feedback information indicating successful decoding could be treated as receipt of decoding failure feedback information at 804 in some embodiments. If decoding failure feedback information is not received, then further TB s could be transmitted at 802, or the method could end and subsequently be performed again when additional CBs are to be transmitted.

At 810, after a further decoding failure in the example shown, another parity check CB is generated. For illustrative purposes, the parity check CB at 806 could be considered a first parity check CB, and the parity check CB at 810 could be considered a second parity check CB.

The second parity check CB is also based on the contents of the TB, but is different from the first parity check CB, and is transmitted to the second network device at 814. In an embodiment, the second parity check CB is first encoded by the first network device, by FEC encoding for example, to obtain an encoded second parity check codeword. In such an embodiment, the transmitting at 814 involves transmitting the encoded second parity check codeword. One or more different parity check CBs could be generated at 810 and transmitted at 814, in a single pass through the operations illustrated at 808, 810, 814 or in multiple passes as illustrated in FIG. 8 by the dashed arrow between 814 and 808. Iteration of the operations at 808, 810, 812, 814 could be exited in the absence of feedback information at 808, and/or after a certain number of decoding failures.

Feedback information received at 808 after transmission of a parity check CB at 806 is a result of a first instance of parity-based detection of decoding failure of the TB in the example shown. Similarly, feedback information received after transmission of a parity check CB at 810 is a result of a second or subsequent instance of parity-based detection of decoding failure of the TB for a second or subsequent time. Different parity check CBs could be generated after each instance of parity-based detection of decoding failure of the TB.

The method 800 is intended to be an illustrative and non-limiting example. Embodiments could include additional, fewer, or different operations, performed in the order shown or in a different order. Operations could also or instead be performed in any of various ways.

For example, generating a parity check CB at 810 could involve performing a cyclic shift parity check scheme to obtain a shifted parity check CB as the second parity check CB. In an embodiment, performing a cyclic shift parity check scheme involves performing, by the first network device, a cyclic shift operation for each CB to obtain shifted CBs, and performing, by the first network device, an XOR operation for the shifted CBs to obtain the shifted parity check CB. The shifted CBs could include one or more left shifted CBs, one or more right shifted CBs, or both one or more left shifted CBs and one or more right shifted CBs.

A cyclic shift operation by the first network device could involve performing an $(i-1)^{th}$ cyclic shift of CBs to obtain shifted CBs $\tilde{\vec{c}}_i^{(i-1)}$, wherein $\vec{c}_i$ is $\{c_{i,0}, c_{i,1}, \ldots, c_{i,k-1}\}$, and k is the number of information bits $c_{i,0}, c_{i,1}, \ldots, c_{i,k-1}$ in the CBs. Regarding an XOR operation, this could involve performing the XOR operation to obtain the shifted parity check CB $\vec{p}_2$, wherein the $\vec{p}_2$ is $p_{2,l} = \tilde{c}_{1,l}^{(0)} \oplus \tilde{c}_{2,l}^{(1)} \oplus \ldots \oplus \tilde{c}_{m,l}^{(m-1)}$, and m is the number of CBs in the TB, for example.

Such a method could be performed, for example, by a UE and/or a base station. In one embodiment, the first network device is a UE and the second network device is a base station; in another embodiment, the first network device is a base station and the second network device is a UE.

Figure 9:
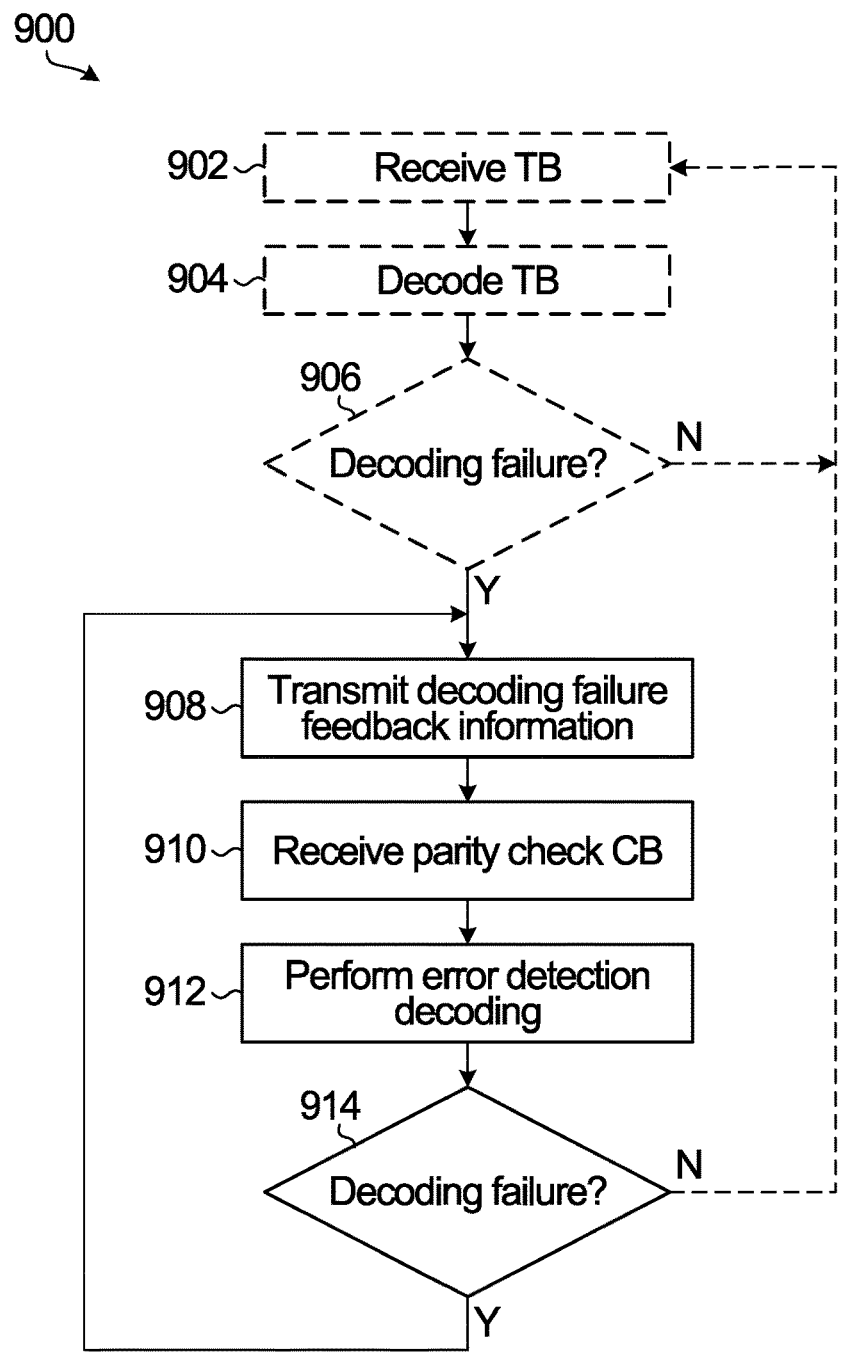
FIG. 9 is a flow diagram illustrating an example receive-side method according to a further embodiment.

FIG. 9 is a flow diagram illustrating an example receive-side method according to a further embodiment. The method 900 could be considered a receive-side counterpart of method 800 in FIG. 8. The method of FIG. 8 could be performed by a first network device, and a second network device in communication with the first network device could perform the method of FIG. 9.

The method 900 could involve receiving a TB, which includes m CBs, from a first network device at 902. One or multiple TB s could be received at 902. Decoding of the received TB(s) is shown at 904, and could involve FEC decoding for example. At 906, it is determined whether there has been a decoding failure, which could involve one or more of the CBs in any received TB. If there has not been a decoding failure, then further TB s received at 902 may be decoded, or the method could end and subsequently be performed again when additional CBs are received.

At 908, after a decoding failure has been detected, feedback information that indicates the decoding failure is transmitted. In the above example of a second network device performing the method 900, the feedback information is sent by the second network device to the first network device at 908. The second network device receives a parity check CB at 910. The parity check CB is based on contents of the TB. The received parity check CB, which is a first parity check CB in this example, could be received in the form of an encoded parity check codeword, and decoded at 910. Error detection decoding of the TB, such as a CRC check, is performed at 912.

If a decoding failure is detected at 914, then feedback information is again sent to the first network device at 908, and a second parity check CB that is also based on the contents of the TB but is different from the first parity check CB is received from the first network device at 910. As described above for the first parity check CB, the second parity check CB could have been encoded into an encoded second parity check codeword, in which case the encoded second parity check codeword is decoded to recover the second parity check CB.

Based on the second parity check CB, the second network device performs error detection decoding of the TB. In the event of detection of a further decoding failure at 914, the operations at 908, 910, 912, 914 could be repeated. In another embodiment, a single pass through these operations could involve multiple parity CBs and error detection decoding based on those CBs.

After successful decoding, as determined at 914, further TB s could be received at 902, or the method could end and subsequently be performed again when additional CBs are received. Iteration of the operations at 908, 910, 912, 914 could also or instead be exited after a certain number of decoding failures have been detected at 914.

The method 900 is intended to be an illustrative and non-limiting example. As described above with reference to FIG. 8, embodiments of receive-side or decoding-side methods could include additional, fewer, or different operations, performed in the order shown or in a different order. Operations could also or instead be performed in any of various ways.

As an example, a second or subsequent parity check CB received at 910 could have been generated according to a cyclic shift parity check scheme that involves performing a cyclic shift operation for each CB in the TB to obtain shifted CBs and performing an XOR operation for the shifted CBs to obtain a shifted parity check CB as the second parity check CB.

Performing error detection decoding at 912 could involve performing a series of XOR operations to remove successfully decoded CBs from the second parity check CB, setting $c_{i,0}=0$ or $c_{i,0}=1$, where i is a code block index of a failed CB that is not successfully decoded from the TB; and performing, by the second network device, a series of XOR operations to recover the failed CB.

As described above with reference to FIG. 8, a TB and a parity check CB could be transmitted separately or together, and/or without necessarily first receiving decoding failure feedback information. Similarly, a TB and a parity check CB could be received separately or together. A parity check CB could also or instead be received without necessarily first detecting a decoding failure and transmitting decoding failure feedback information.

In the above description of FIG. 8, it is further noted that non-receipt of feedback information indicating successful decoding could be treated, by a network device from which a TB was transmitted, as receipt of decoding failure feedback information. Therefore, although the example method 900 illustrates transmission of decoding failure feedback information at 908, in some embodiments this could involve non-transmission of successful decoding feedback information that indicates successful decoding of the TB.

Features that are described above, with reference to FIG. 8 or elsewhere, could also or instead apply to receive-side or decoding-side methods. For example, like the method 800, the method 900 could also involve first and second parity CBs and/or first and second feedback information, which could be embodied as described by way of example above.

A network device, examples of which are described in detail above with reference to FIGS. 2A, 2B, and 7, could include a processor and a computer readable storage medium storing programming for execution by the processor. The programming in such an implementation could include instructions to perform actions in accordance with a method as disclosed herein, such as the method of FIG. 8 and the above description thereof. Such programming could also or instead include instructions to perform actions in accordance with a receive-side or decoding-side method, such as the method of FIG. 9 and the above description thereof.

Transmit-side or encoding-side features as disclosed herein could be implemented in different ways in other embodiments. For example, a transmitter in a first network device could be configured to transmit, to a second network device, a TB and a first parity check CB. A receiver in the first network device could be configured to receive, from the second network device, feedback information indicating a decoding failure of the TB. An error detection encoder could be coupled to the receiver and configured to generate a second parity check CB that is different from the first parity check CB. The transmitter could be coupled to the error detection encoder and configured to transmit the second parity check CB to the second network device. These components, and/or other components such as a FEC encoder, could be further configured to perform other operations as disclosed herein.

Similarly, receive-side or decoding-side features could also or instead be implemented in different ways. A receiver in a network device could be configured to receive, from a first network device, a TB and a first parity check CB. A transmitter in the network device could be configured to send feedback information to the first network device, indicating a decoding failure of the TB. A receiver in the network device could be configured to receive, from the first network device, a second parity check CB that is different from the first parity check CB. An error detection decoder could be coupled to the receiver and configured to perform error detection decoding of the m CBs based on the second parity check CB. These components, and/or other components such as a FEC decoder, could be further configured to perform other operations as disclosed herein.

In general, one or more steps of the embodiment methods provided herein may be performed by corresponding units or modules. For example, a signal may be transmitted by a transmitting unit or a transmitting module. A signal may be received by a receiving unit or a receiving module. A signal may be processed by a processing unit or a processing module. Other steps may be performed by an error detection encoding unit or module, an error detection decoding unit or module, a FEC encoding unit or module, and/or a FEC encoding unit or module. The respective units/modules may be hardware, software, or a combination thereof. For instance, one or more of the units/modules may be an integrated circuit, such as field programmable gate arrays (FPGAs) or application-specific integrated circuits (ASICs). It will be appreciated that where the modules are implemented using one or more devices that execute software, such software may be retrieved by a device such as a processor, in whole or part as needed, individually or together for processing, in single or multiple instances as required, and that the modules themselves may include instructions for further deployment and instantiation.

Various embodiments are described herein, including features that may be provided at first and second network devices, a transmit-/encoding-side, or a receive-/decoding-side. A communication network or system may include, for example, both a first network device implementing transmit-/encoding-side features and a second network device implementing transmit-/encoding-side features.

It should also be appreciated that the disclosed embodiments are illustrative examples. Other embodiments may include variations of disclosed features. For example, cyclic shifting of CBs represents one example of an operation or transformation that could be applied to CBs in generating different parity check CBs in the event of a decoding failure. Other options include, for example, using CB based random interleavers to permute data CBs before the XOR operation that is used to generate a parity check CB.

Although the present invention has been described with reference to specific features and embodiments thereof, various modifications and combinations can be made thereto without departing from the invention. The description and drawings are, accordingly, to be regarded simply as an illustration of some embodiments of the invention as defined by the appended claims, and are contemplated to cover any and all modifications, variations, combinations or equivalents that fall within the scope of the present invention. Therefore, although the present invention and its advantages have been described in detail, various changes, substitutions and alterations can be made herein without departing from the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Moreover, any module, component, or device exemplified herein that executes instructions may include or otherwise have access to a non-transitory computer/processor readable storage medium or media for storage of information, such as computer/processor readable instructions, data structures, program modules, and/or other data. A non-exhaustive list of examples of non-transitory computer/processor readable storage media includes magnetic cassettes, magnetic tape, magnetic disk storage or other magnetic storage devices, optical disks such as compact disc read-only memory (CD-ROM), digital video discs or digital versatile disc (DVDs), Blu-ray Disc™, or other optical storage, volatile and non-volatile, removable and non-removable media implemented in any method or technology, random-access memory (RAM), read-only memory (ROM), electrically erasable programmable read-only memory (EEPROM), flash memory or other memory technology. Any such non-transitory computer/processor storage media may be part of a device or accessible or connectable thereto. Any application or module herein described may be implemented using computer/processor readable/executable instructions that may be stored or otherwise held by such non-transitory computer/processor readable storage media.

The invention claimed is:

1. A method comprising:
    transmitting, by a first network device to a second network device, a transport block (TB) and a first parity check code block (CB) that is based on contents of the TB;
    receiving, by the first network device, feedback information from the second network device, wherein the feedback information indicates a decoding failure of the TB;
    generating, by the first network device after receiving the feedback information, a second parity check CB that is based on the contents of the TB and is different from the first parity check CB;
    transmitting, by the first network device, the second parity check CB to the second network device.

2. The method of claim 1, wherein the generating comprises performing a cyclic shift parity check scheme to obtain a shifted parity check CB as the second parity check CB.

3. The method of claim 2, wherein performing a cyclic shift parity check scheme comprises:
    performing, by the first network device, a cyclic shift operation for each CB in the TB to obtain shifted CBs;
    performing, by the first network device, an XOR operation for the shifted CBs to obtain the shifted parity check CB.

4. The method of claim 3, wherein performing a cyclic shift operation comprises:
    performing, by the first network device, an $(i-1)^{th}$ cyclic shift of CBs to obtain shifted CBs $\tilde{\vec{c}}_i^{(i-1)}$, wherein $\vec{c}_i$ is $\{c_{i,0}, c_{i,1}, \ldots, c_{i,k-1}\}$, and k is the number of information bits $c_{i,0}, c_{i,1}, \ldots, c_{i,k-1}$ in the CBs.

5. The method of claim 4, wherein performing the XOR operation comprises:
    performing the XOR operation to obtain the shifted parity check CB $\vec{p}_2$, wherein the $\vec{p}_2$ is $p_{2,1} = \tilde{c}_{1,l}^{(0)} \oplus \tilde{c}_{2,l}^{(1)} \oplus \ldots \oplus \tilde{c}_{m,l}^{(m-1)}$, m is a number of CBs in the TB.

6. The method of claim 2, further comprising:
    encoding, by the first network device, the shifted parity check CB to obtain an encoded second parity check codeword;
    wherein transmitting the second parity check CB comprises transmitting, by the first network device, the encoded second parity check codeword to the second network device.

7. The method of claim 1, further comprising, before transmitting the first parity check CB to the second network device:
    receiving, by the first network device, first feedback information from the second network device, wherein the first feedback information indicates a first decoding failure of the TB.

8. The method of claim 7, further comprising:
    performing, by the first network device, an XOR operation for CBs in the TB to obtain the first parity check CB.

9. The method of claim 1, wherein the first network device is a UE, and the second network device is a base station; or the first network device is a base station, and the second network device is a UE.

10. A network device comprising:
    a processor; and
    a computer readable storage medium storing programming for execution by the processor, the programming including instructions to perform actions in accordance with a method that comprises:
    transmitting, by the network device to a second network device, a transport block (TB) and a first parity check code block (CB) that is based on contents of the TB;
    receiving feedback information from the second network device, wherein the feedback information indicates a decoding failure of the TB;
    generating, after receiving the feedback information, a second parity check CB that is based on the contents of the TB and is different from the first parity check CB;
    transmitting the second parity check CB to the second network device.

11. The network device of claim 10, wherein the generating comprises performing a cyclic shift parity check scheme to obtain a shifted parity check CB as the second parity check CB.

12. The network device of claim 11, wherein performing a cyclic shift parity check scheme comprises:
    performing a cyclic shift operation for each CB in the TB to obtain shifted CBs;
    performing an XOR operation for the shifted CBs to obtain the shifted parity check CB.

13. The network device of claim 12, wherein performing a cyclic shift operation comprises:
    performing an $(i-1)^{th}$ cyclic shift of CBs to obtain shifted CBs $\tilde{\vec{c}}_i^{(i-1)}$, wherein $\vec{c}_i$ is $\{c_{i,0}, c_{i,1}, \ldots, c_{i,k-1}\}$, and k is the number of information bits $c_{i,0}, c_{i,1}, \ldots, c_{i,k-1}$ in the CBs.

14. The network device of claim 13, wherein performing the XOR operation comprises:
    performing the XOR operation to obtain the shifted parity check CB $\vec{p}_2$, wherein the $\vec{p}_2$ is $p_{2,1} = \tilde{c}_{1,l}^{(0)} \oplus \tilde{c}_{2,l}^{(1)} \oplus \ldots \oplus \tilde{c}_{m,l}^{(m-1)}$, m is a number of CBs in the TB.

15. The network device of claim 11, wherein the method further comprises:
    encoding the shifted parity check CB to obtain an encoded second parity check codeword;
    wherein transmitting the second parity check CB comprises transmitting the encoded second parity check codeword to the second network device.

16. The network device of claim 10, wherein the method further comprises, before transmitting the first parity check CB to the second network device:
  receiving first feedback information from the second network device, wherein the first feedback information indicates a first decoding failure of the TB.

17. The network device of claim 16, wherein the method further comprises:
  performing an XOR operation for the CBs in the TB to obtain the first parity check CB.

18. The network device of claim 10, wherein the network device is a UE, and the second network device is a base station; or the first network device is a base station, and the second network device is a UE.

19. A method comprising:
  receiving, by a second network device from a first network device, a transport block (TB) and a first parity check code block (CB) that is based on contents of the TB;
  sending, by the second network device, feedback information to the first network device; wherein the feedback information indicates a decoding failure of the TB;
  receiving, by the second network device after sending the feedback information, a second parity check CB from the first network device, wherein the second parity check CB is based on the contents of the TB and is different from the first parity check CB;
  performing, by the second network device, error detection decoding of the TB on the second parity check CB.

20. The method of claim 19, wherein the second parity check CB is generated according to a cyclic shift parity check scheme that comprises performing a cyclic shift operation for each CB in the TB to obtain shifted CBs and performing an XOR operation for the shifted CBs to obtain a shifted parity check CB as the second parity check CB.

21. The method of claim 19, wherein the performing comprises:
  performing, by the second network device, a series of XOR operations to remove, from the second parity check CB, CBs that are successfully decoded from the TB;
  setting $c_{i,0}=0$ or $c_{i,0}=1$, where i is a code block index of a failed CB that is not successfully decoded from the TB;
  performing, by the second network device, a series of XOR operations to recover the failed CB.

22. A network device comprising:
  a processor; and
  a computer readable storage medium storing programming for execution by the processor, the programming including instructions to perform actions in accordance with a method that comprises:
  receiving, by the network device from a first network device, a transport block (TB) and a first parity check code block (CB) that is based on contents of the TB;
  sending feedback information to the first network device; wherein the feedback information indicates a decoding failure of the TB;
  receiving, after sending the feedback information, a second parity check CB from the first network device, wherein the second parity check CB is based on the contents of the TB and is different from the first parity check CB;
  performing error detection decoding of the TB based on the second parity check CB.

23. The network device of claim 22, wherein the second parity check CB is generated according to a cyclic shift parity check scheme that comprises performing a cyclic shift operation for each CB in the TB to obtain shifted CBs and performing an XOR operation for the shifted CBs to obtain a shifted parity check CB as the second parity check CB.

24. The network device of claim 22, wherein the performing comprises:
  performing a series of XOR operations to remove, from the second parity check CB, CBs that are successfully decoded from the TB;
  setting $c_{i,0}=0$ or $c_{i,0}=1$, where i is a code block index of a failed CB that is not successfully decoded from the TB;
  performing a series of XOR operations to recover the failed CB.

* * * * *